(12) United States Patent
Nakaoka

(10) Patent No.: US 12,356,714 B2
(45) Date of Patent: Jul. 8, 2025

(54) SEMICONDUCTOR INTEGRATED CIRCUIT DEVICE

(71) Applicant: Socionext Inc., Kanagawa (JP)

(72) Inventor: Yasuhiro Nakaoka, Yokohama (JP)

(73) Assignee: SOCIONEXT INC., Kanagawa (JP)

(*) Notice: Subject to any disclaimer, the term of this patent is extended or adjusted under 35 U.S.C. 154(b) by 580 days.

(21) Appl. No.: 17/720,802

(22) Filed: Apr. 14, 2022

(65) Prior Publication Data
US 2022/0246644 A1 Aug. 4, 2022

Related U.S. Application Data

(63) Continuation of application No. PCT/JP2020/038662, filed on Oct. 13, 2020.

(30) Foreign Application Priority Data

Oct. 18, 2019 (JP) .................. 2019-191448

(51) Int. Cl.
H10D 84/90 (2025.01)
H10D 30/67 (2025.01)
H10D 62/10 (2025.01)

(52) U.S. Cl.
CPC ....... H10D 84/907 (2025.01); H10D 30/6735 (2025.01); H10D 30/6757 (2025.01); H10D 62/118 (2025.01); H10D 84/975 (2025.01)

(58) Field of Classification Search
CPC .......... H01L 29/78696; H01L 29/0673; H10D 30/6735; H10D 30/6757; H10D 62/121
See application file for complete search history.

(56) References Cited

U.S. PATENT DOCUMENTS 5,093,661 A * 3/1992 Tanimoto ............. H03M 1/685
341/154
2016/0111337 A1 4/2016 Hatcher et al.
(Continued)

FOREIGN PATENT DOCUMENTS

JP H05-067634 A 3/1993
JP 2009-016525 A 1/2009
(Continued)

OTHER PUBLICATIONS

International Search Report (ISR) dated Dec. 22, 2020 issued in International Patent Application No. PCT/JP2020/038662, with English translation.
(Continued)

Primary Examiner — Samuel A Gebremariam
Assistant Examiner — Jonas T Beardsley
(74) Attorney, Agent, or Firm — Rimon P.C.

(57) ABSTRACT

A terminal cell includes: third and fourth nanosheets formed at the same positions as first and second nanosheets, respectively, in the Y direction; and first and second dummy gate interconnects surrounding the peripheries of the third and fourth nanosheets, respectively, in the Y direction. Faces of the first and third nanosheets on one side in the Y direction are exposed from a first gate interconnect and the first dummy gate interconnect, respectively. Faces of the second and fourth nanosheets on one side in the Y direction are exposed from a second gate interconnect and the second dummy gate interconnect, respectively.

11 Claims, 15 Drawing Sheets

(56) References Cited

U.S. PATENT DOCUMENTS

| | | |
|---|---|---|
| 2019/0123063 A1 | 4/2019 | Hino et al. |
| 2019/0164993 A1 | 5/2019 | Shimbo |
| 2019/0244949 A1 | 8/2019 | Iwahori |
| 2020/0104460 A1* | 4/2020 | Peng .................... H01L 29/775 |
| 2020/0286918 A1 | 9/2020 | Hino et al. |
| 2021/0028162 A1 | 1/2021 | Iwahori |
| 2021/0104552 A1 | 4/2021 | Shimbo |
| 2021/0242242 A1 | 8/2021 | Hino et al. |

FOREIGN PATENT DOCUMENTS

| | | |
|---|---|---|
| WO | 2018/003634 A1 | 1/2018 |
| WO | 2018/025580 A1 | 2/2018 |
| WO | 2018/074172 A1 | 4/2018 |

OTHER PUBLICATIONS

P. Weckx et al., "Stacked nanosheet fork architecture for SRAM design and device co-optimization toward 3nm", 2017 IEEE International Electron Devices Meeting (IEDM), Dec. 2017, IEDM17-505~508.

\* cited by examiner

FIG.3
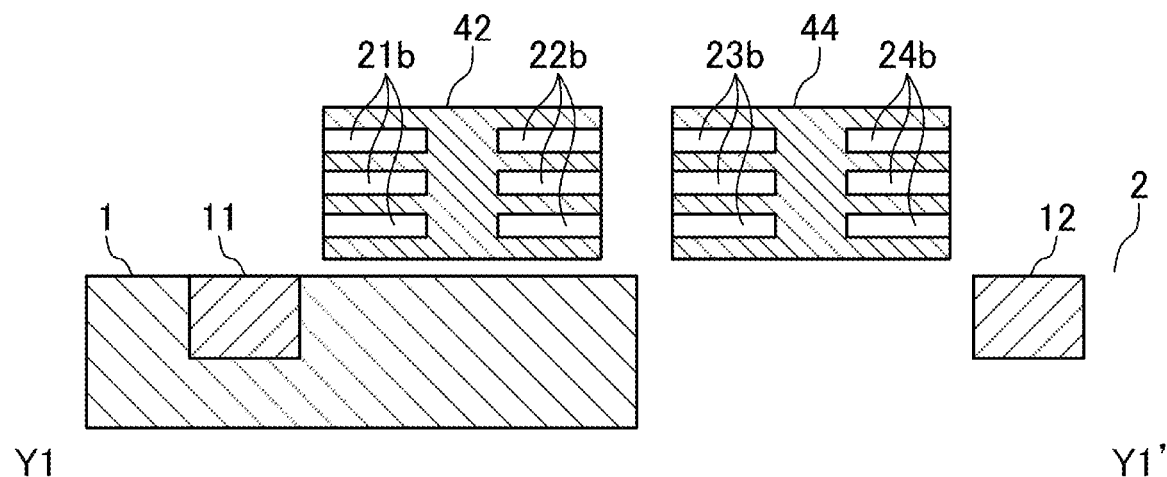
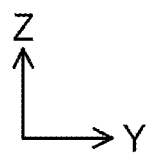
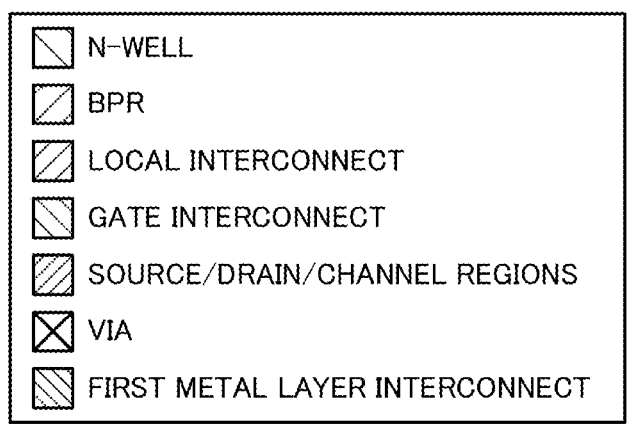

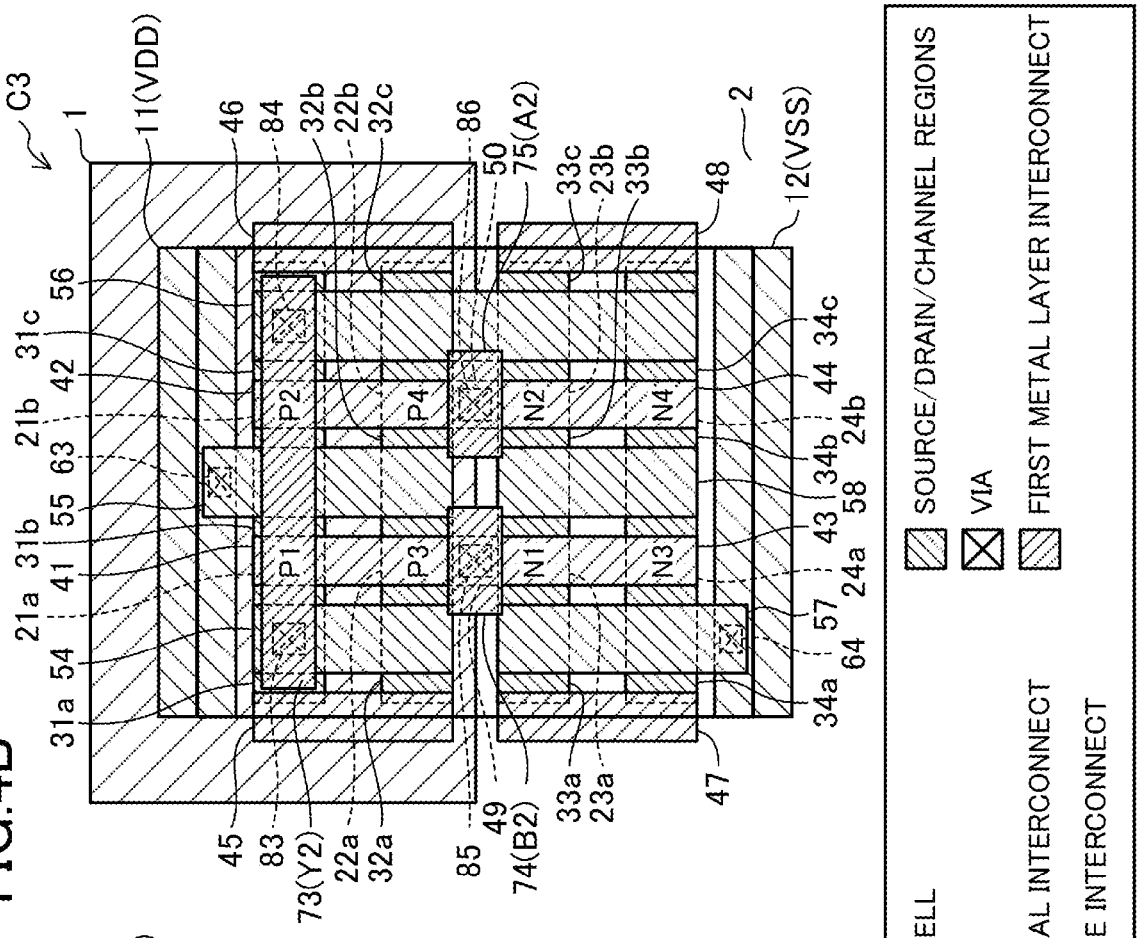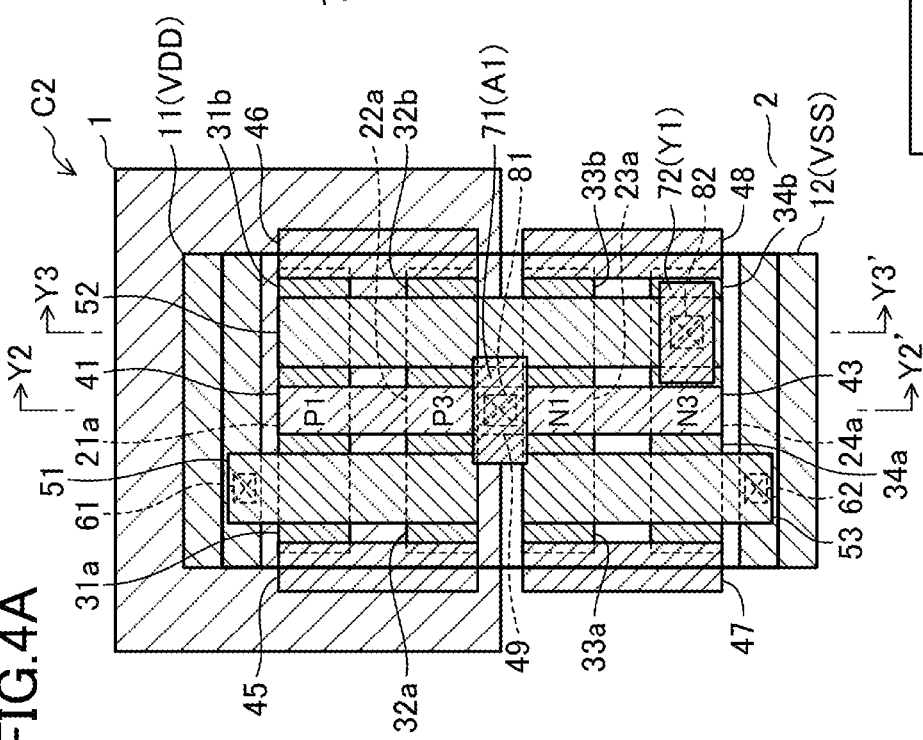

FIG.8A
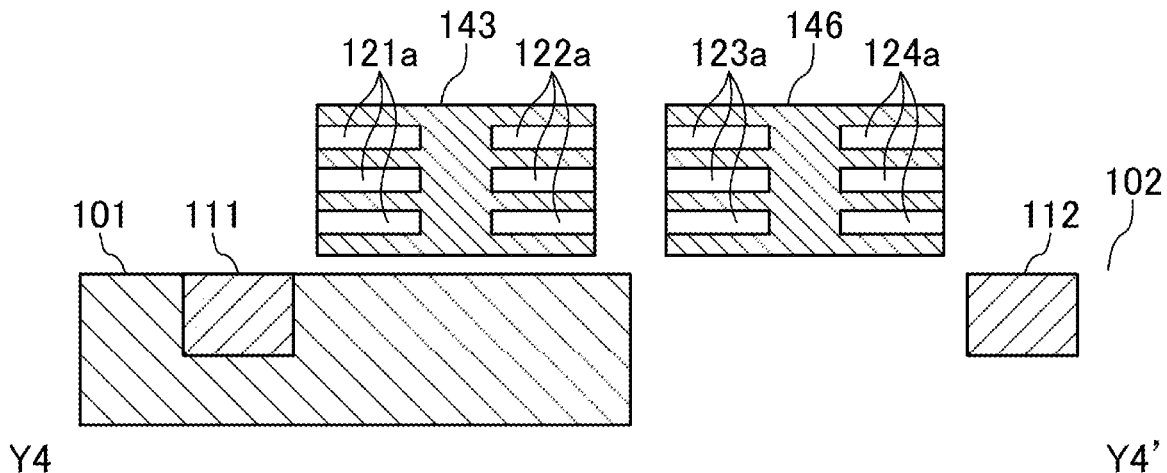
FIG.8B
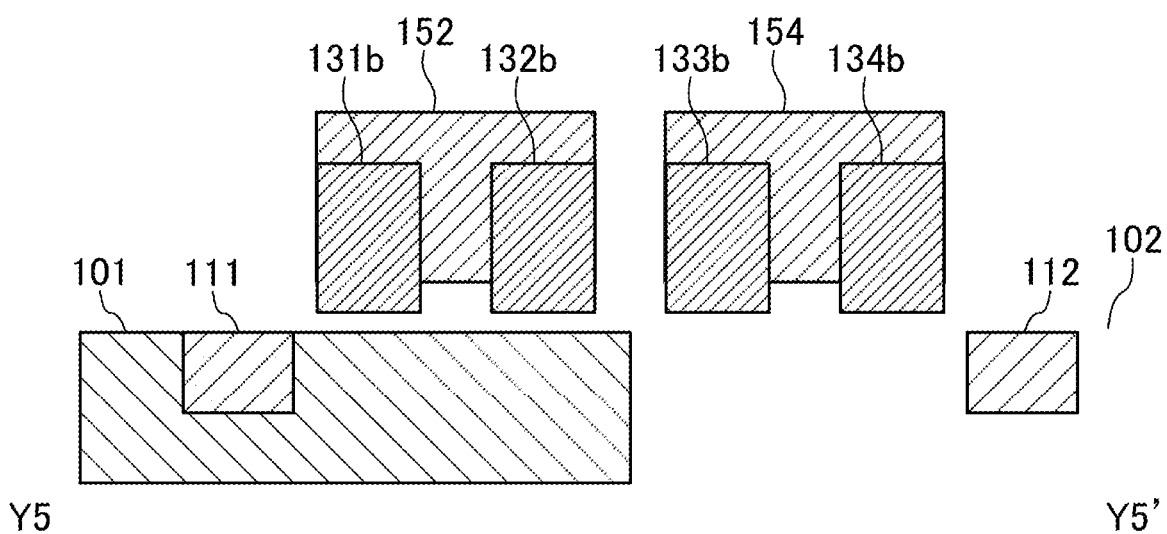
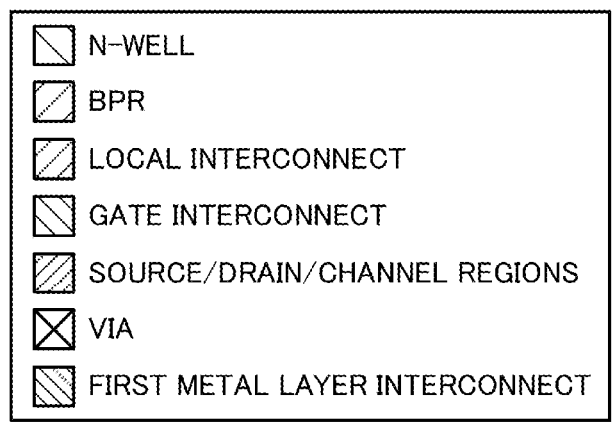

FIG.9A
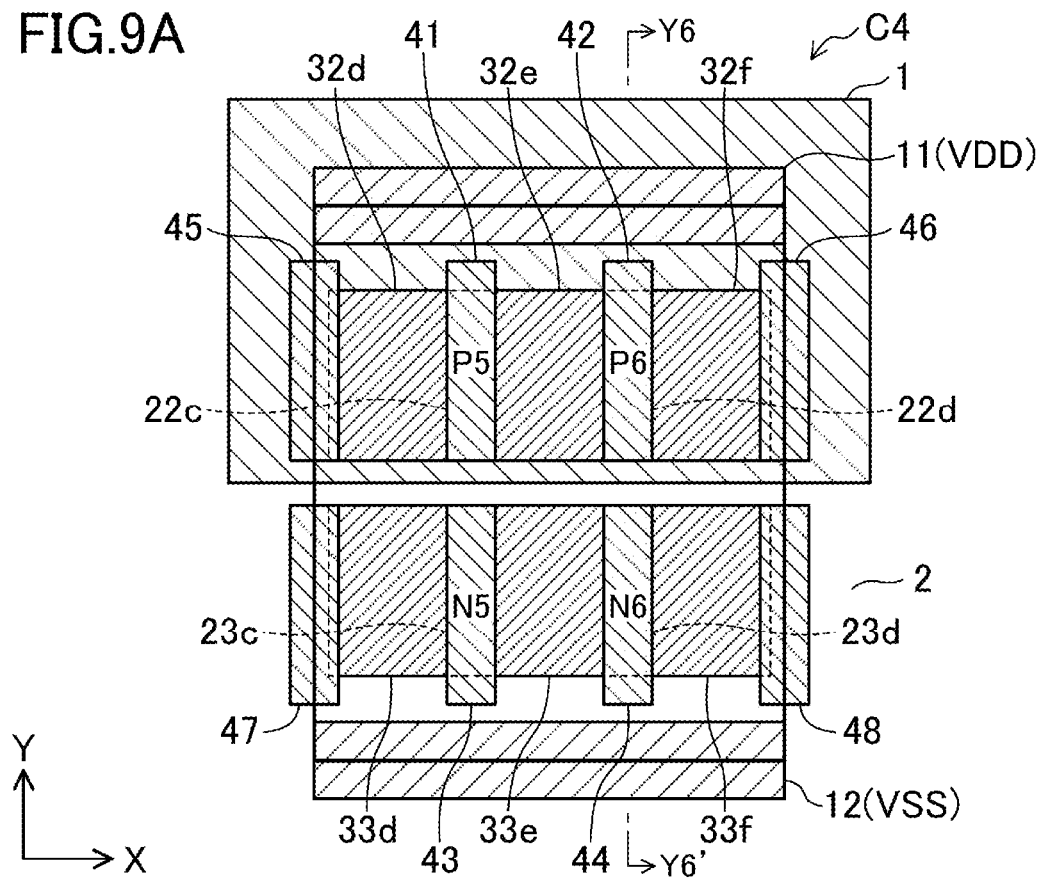
FIG.9B
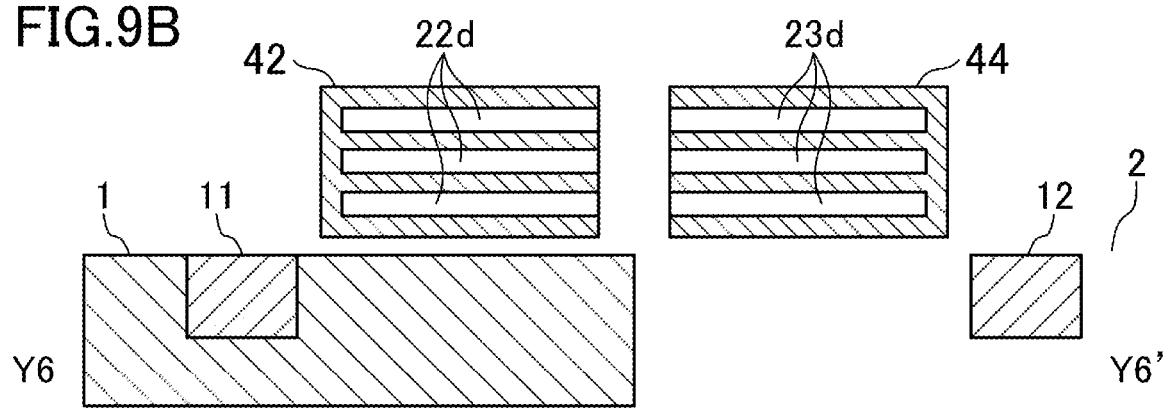
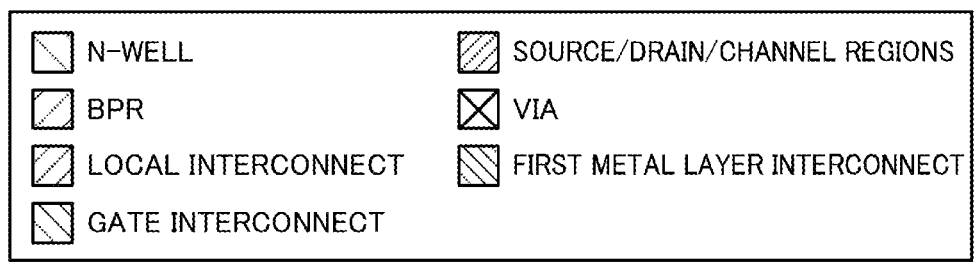

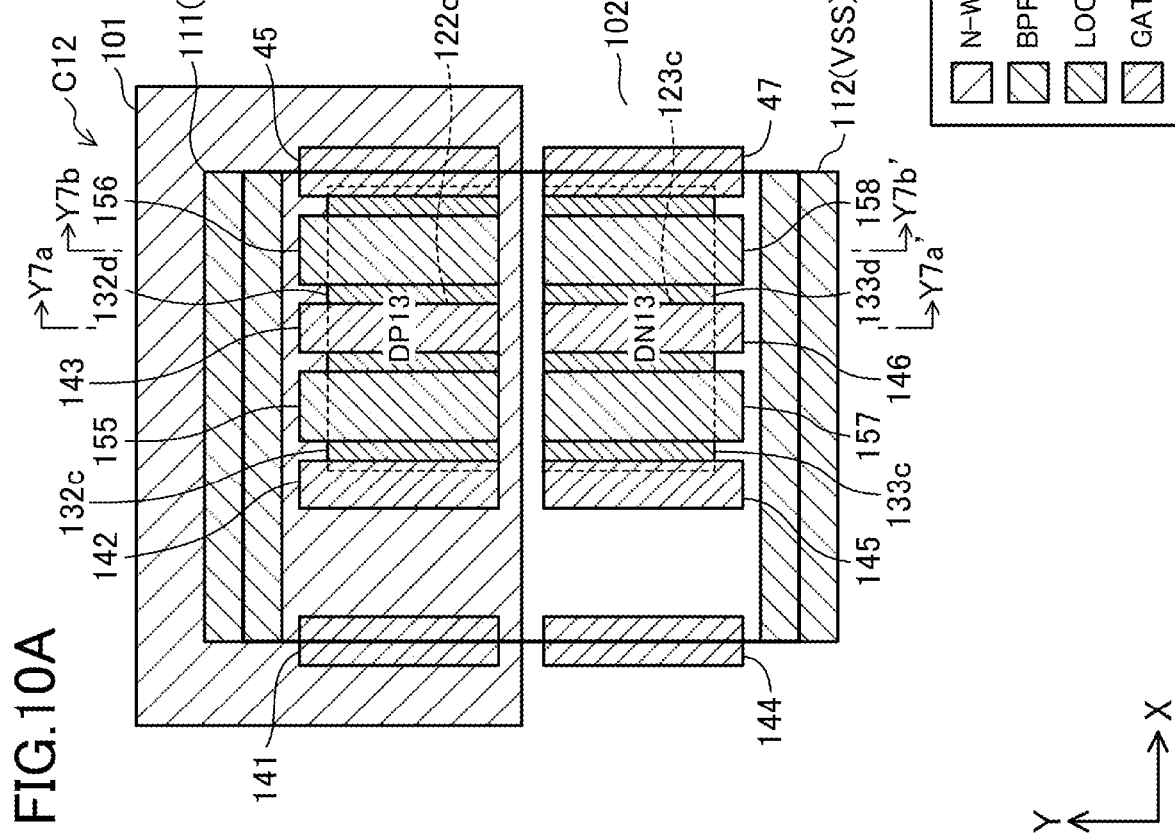

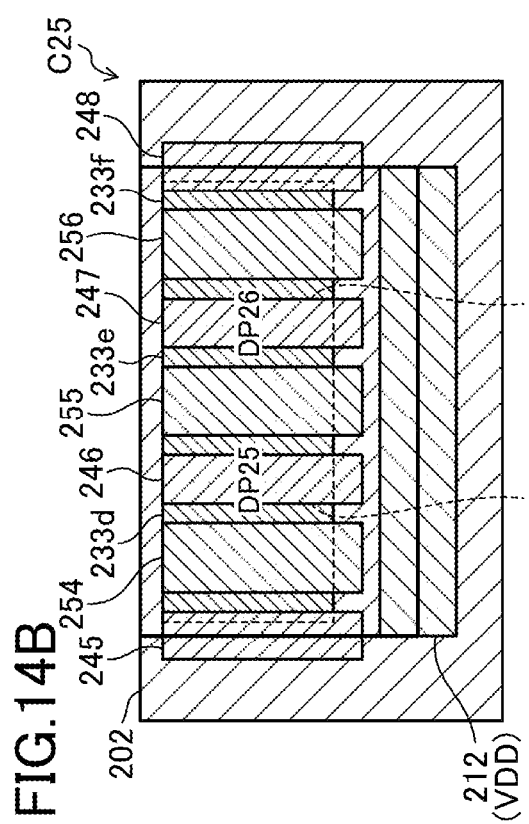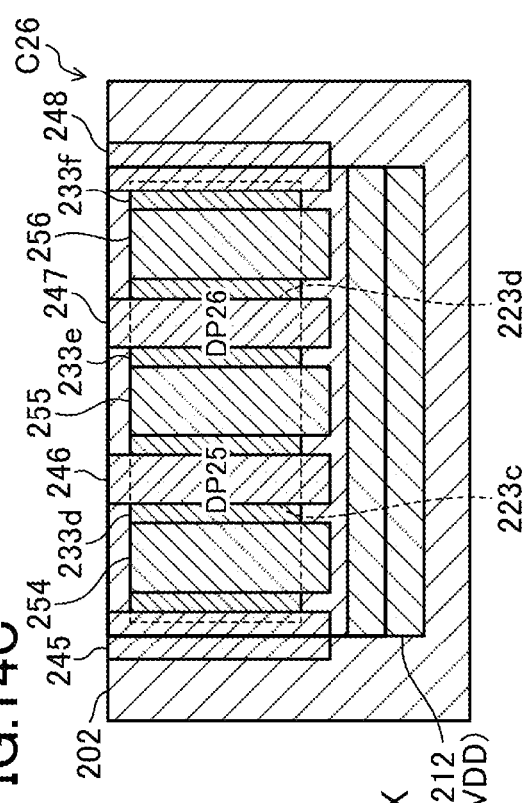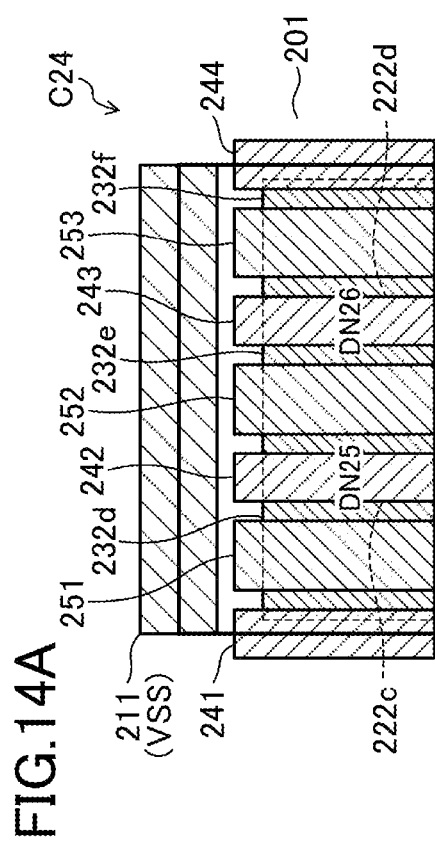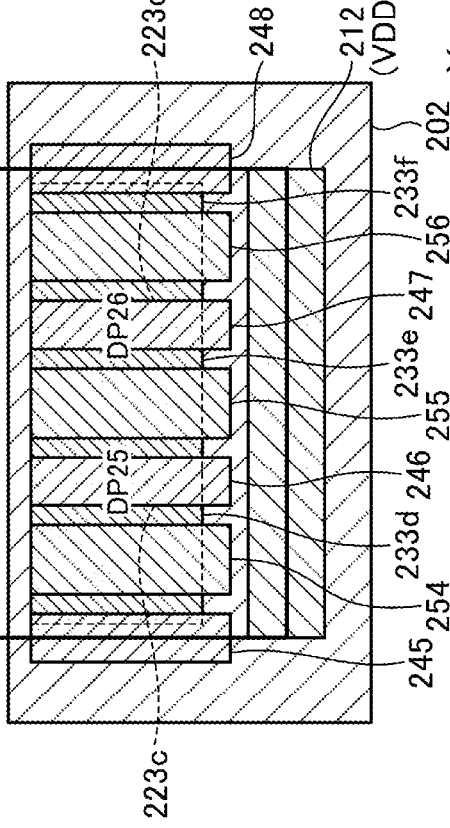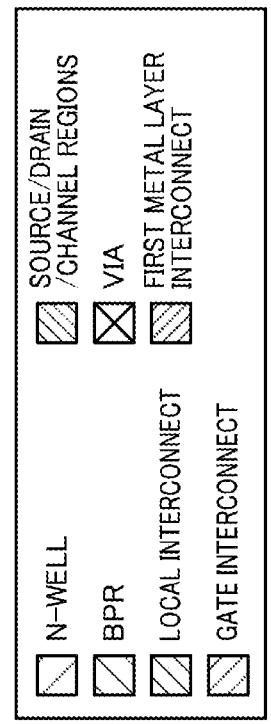

FIG.15A
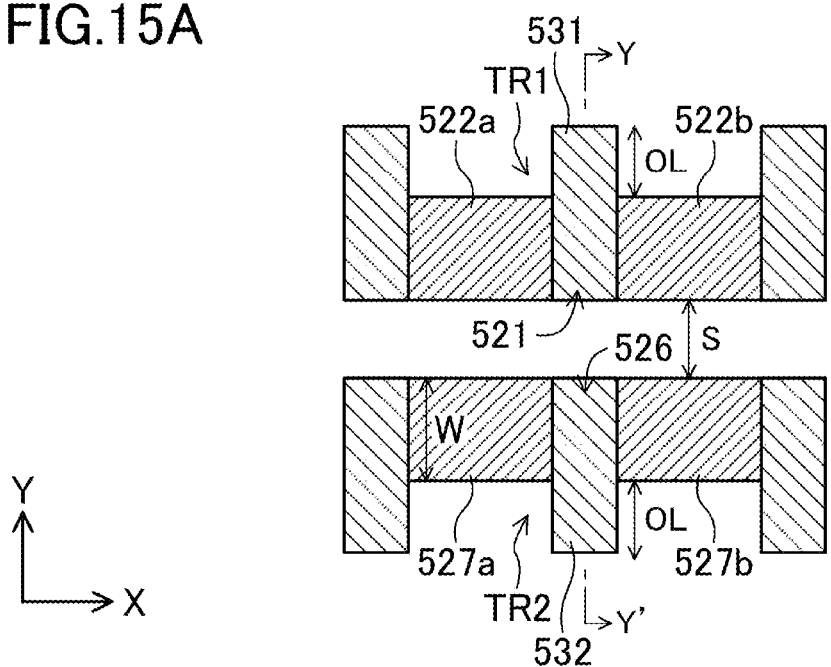
FIG.15B
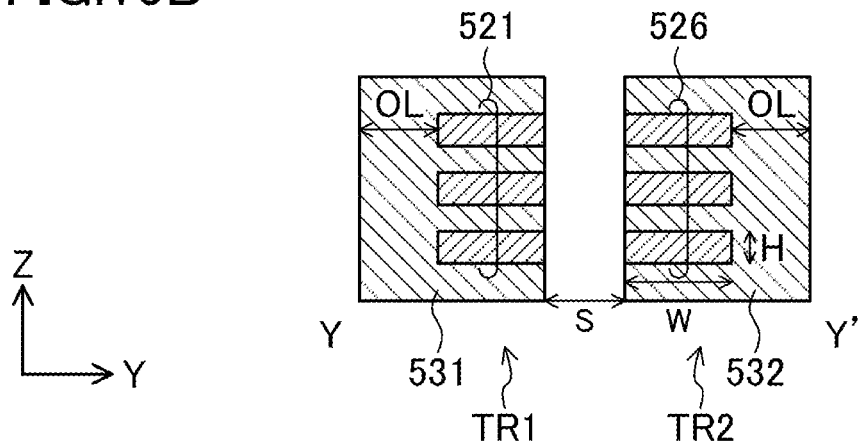
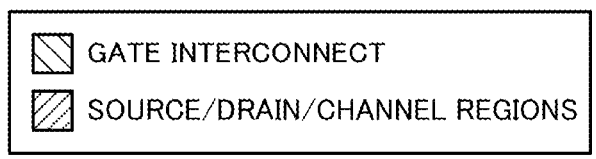

SEMICONDUCTOR INTEGRATED CIRCUIT DEVICE

CROSS-REFERENCE TO RELATED APPLICATIONS

This is a continuation of International Application No. PCT/JP2020/038662 filed on Oct. 13, 2020, which claims priority to Japanese Patent Application No. 2019-191448 filed on Oct. 18, 2019. The entire disclosures of these applications are incorporated by reference herein.

BACKGROUND

The present disclosure relates to a semiconductor integrated circuit device provided with standard cells (hereinafter simply called cells as appropriate) including nanosheet field effect transistors (FETs).

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

As for transistors as basic constituents of an LSI, improvement in integration degree, reduction in operating voltage, and improvement in operating speed have been achieved thanks to scaling down of the gate length. Recently, however, increase in off current due to excessive scaling and the resulting significant increase in power consumption have raised a problem. To solve this problem, three-dimensional transistors having a three-dimensional structure changed from the conventional planar structure have been vigorously studied. As one type of such three-dimensional transistors, nanosheet FETs (nanowire FETs) have received attention.

Among other kinds of nanosheet FETs, a forksheet transistor in which its gate electrode is shaped like a fork has been proposed. P. Weckx et al., "Stacked nanosheet fork architecture for SRAM design and device co-optimization toward 3 nm," 2017 IEEE International Electron Devices Meeting (IEDM), December 2017, IEDM17-505-508 discloses a layout of SRAM memory cells using forksheet transistors and achieves reduction in the area of the semiconductor integrated circuit device (semiconductor memory device).

As used herein, the nanosheet FET having a fork-shaped gate electrode is called a forksheet transistor following the prior art.

Note that the standard cells include, in addition to cells having logical functions such as a NAND gate and a NOR gate (hereinafter called logical cells as appropriate), cells having no logical function. Examples of such cells having no logical function include a "terminal cell." The "terminal cell" is a cell that does not contribute to any logical function of a circuit block but is used to terminate the circuit block. With placement of such terminal cells, it is possible to control variations in the finished shape of the layout pattern of cells located inside with respect to the terminal cells, and thus achieve control of variations in the manufacture, and improvement in the yield and reliability, of the semiconductor integrated circuit device.

No concrete examination has been made so far on the structure of terminal cells using forksheet transistors and the layout of a semiconductor integrated circuit device including terminal cells using forksheet transistors.

An objective of the present disclosure is providing a layout structure of a semiconductor integrated circuit device including terminal cells using forksheet transistors.

SUMMARY

According to the first mode of the present disclosure, a semiconductor integrated circuit device includes a plurality of cell rows each having a plurality of standard cells arranged in a first direction, wherein a first cell row, as one of the plurality of cell rows, includes a first standard cell having a logical function and a second standard cell having no logical function placed at at least one of both ends of the first cell row. The first standard cell includes a first region that is a region for formation of a transistor of a first conductivity type, a second region that is a region for formation of a transistor of a second conductivity type different from the first conductivity type and is adjacent to the first region in a second direction vertical to the first direction, a first nanosheet extending in the first direction, formed in the first region, a second nanosheet extending in the first direction, formed in the second region, a first gate interconnect extending in the second direction, surrounding a periphery of the first nanosheet in the second direction and in a third direction perpendicular to the first and second directions, and a second gate interconnect extending in the second direction, surrounding a periphery of the second nanosheet in the second and third directions. The second standard cell includes a third nanosheet extending in the first direction, formed at the same position as the first nanosheet in the second direction, a fourth nanosheet extending in the first direction, formed at the same position as the second nanosheet in the second direction, a first dummy gate interconnect extending in the second direction, surrounding a periphery of the third nanosheet in the second and third directions, and a second dummy gate interconnect extending in the second direction, surrounding a periphery of the fourth nanosheet in the second and third directions. A face of the first nanosheet on a first side that is one side in the second direction is exposed from the first gate interconnect, a face of the second nanosheet on a second side that is one side in the second direction is exposed from the second gate interconnect, a face of the third nanosheet on the first side in the second direction is exposed from the first dummy gate interconnect, and a face of the fourth nanosheet on the second side in the second direction is exposed from the second dummy gate interconnect.

According to the above mode, the second standard cell having no logical function is placed at at least one of both ends of the first cell row including the first standard cell having a logical function. The first standard cell includes first and second nanosheets and first and second gate interconnects surrounding peripheries of the first and second nanosheets, respectively, in the second direction. The second standard cell includes third and fourth nanosheets and first and second dummy gate interconnects surrounding peripheries of the third and fourth nanosheets, respectively, in the second direction. Faces of the first and third nanosheets on the first side that is one side in the second direction are exposed from the first gate interconnect and the first dummy gate interconnect, respectively. Faces of the second and fourth nanosheets on the second side that is one side in the second direction are exposed from the second gate interconnect and the second dummy gate interconnect, respectively. That is, faces of the first and third nanosheets are exposed on the same side in the second direction, and faces of the second and fourth nanosheets are exposed on the same side in the second direction. This makes it possible to achieve control of variations in the manufacture, and improvement in the yield and reliability, of the semiconductor integrated circuit device.

According to the second mode of the present disclosure, a semiconductor integrated circuit device includes a plurality of cell rows each having a plurality of standard cells arranged in a first direction, the plurality of cell rows being arranged in a second direction vertical to the first direction, wherein the plurality of cell rows include a first cell row including a first standard cell having a logical function and a second cell row including a second standard cell having no logical function, the second cell row being placed in either one of both ends of the plurality of cell rows in the second direction. The first standard cell includes a first region that is a region for formation of a transistor of a first conductivity type, a second region that is a region for formation of a transistor of a second conductivity type different from the first conductivity type and is adjacent to the first region in the second direction, a first nanosheet extending in the first direction, formed in the first region, a second nanosheet extending in the first direction, formed in the second region, and formed at the same position as the first nanosheet in the first direction, a first gate interconnect extending in the second direction, surrounding a periphery of the first nanosheet in the second direction and in a third direction perpendicular to the first and second directions, and a second gate interconnect extending in the second direction, surrounding a periphery of the second nanosheet in the second and third directions. The second standard cell includes a third nanosheet extending in the first direction, formed at the same position as the first nanosheet in the first direction, and formed adjacent to the first nanosheet in the second direction, and a first dummy gate interconnect extending in the second direction, surrounding a periphery of the third nanosheet in the second and third directions. A face of the first nanosheet on a first side that is one side in the second direction is exposed from the first gate interconnect, and a face of the second nanosheet on a second side that is one side in the second direction is exposed from the second gate interconnect. Faces of the first and third nanosheets opposed to each other are exposed from the first gate interconnect and the first dummy gate interconnect, respectively, or faces of the first and third nanosheets opposed to each other are not exposed from the first gate interconnect and the first dummy gate interconnect, respectively.

According to the above mode, the second standard cell having no logical function is placed in a cell row on either one of both ends of a plurality of cell rows in the second direction, each cell row including a first standard cell having a logical function. The first standard cell includes a first nanosheet, a second nanosheet formed at the same position as the first nanosheet in the first direction, and first and second gate interconnects surrounding peripheries of the first and second nanosheets, respectively. The second standard cell includes a third nanosheet formed at the same position as the first nanosheet in the first direction, and a first dummy gate interconnect surrounding a periphery of the third nanosheet. A face of the first nanosheet on the first side that is one side in the second direction is exposed from the first gate interconnect, and a face of the second nanosheet on the second side that is one side in the second direction is exposed from the second gate interconnect. Faces of the first and third nanosheets opposed to each other are exposed from the first gate interconnect and the first dummy gate interconnect, respectively, or faces of the first and third nanosheets opposed to each other are not exposed from the first gate interconnect and the first dummy gate interconnect, respectively. That is, when the face of the first nanosheet on the side opposed to the third nanosheet is not covered with the first gate interconnect, the face of the third nanosheet on the side opposed to the first nanosheet is not covered with the first dummy gate interconnect. Conversely, when the face of the first nanosheet on the side opposed to the third nanosheet is covered with the first gate interconnect, the face of the third nanosheet on the side opposed to the first nanosheet is covered with the first dummy gate interconnect. This makes it possible to achieve control of variations in the manufacture, and improvement in the yield and reliability, of the semiconductor integrated circuit device.

According to the present disclosure, it is possible to achieve control of variations in the manufacture, and improvement in the yield and reliability, of the semiconductor integrated circuit device including terminal cells using forksheet transistors.

BRIEF DESCRIPTION OF THE DRAWINGS

FIG. 3 is a cross-sectional view of the layout structure of the logical cell.

FIGS. 4A-4B are plan views showing specific examples of the layout structure of the logical cell.

FIGS. 8A-8B are cross-sectional views showing a layout structure of a terminal cell according to the first embodiment.

FIGS. 9A-9B are views showing a layout structure of a logical cell according to an alteration of the first embodiment.

FIGS. 10A-10C are views showing a layout structure of a terminal cell according to the alteration of the first embodiment.

FIGS. 14A-14C are plan views showing variations of the layout structure of the terminal cell according to the second embodiment.

FIGS. 15A-15B are views showing a basic structure of a forksheet FET.

DETAILED DESCRIPTION

Figure 1:
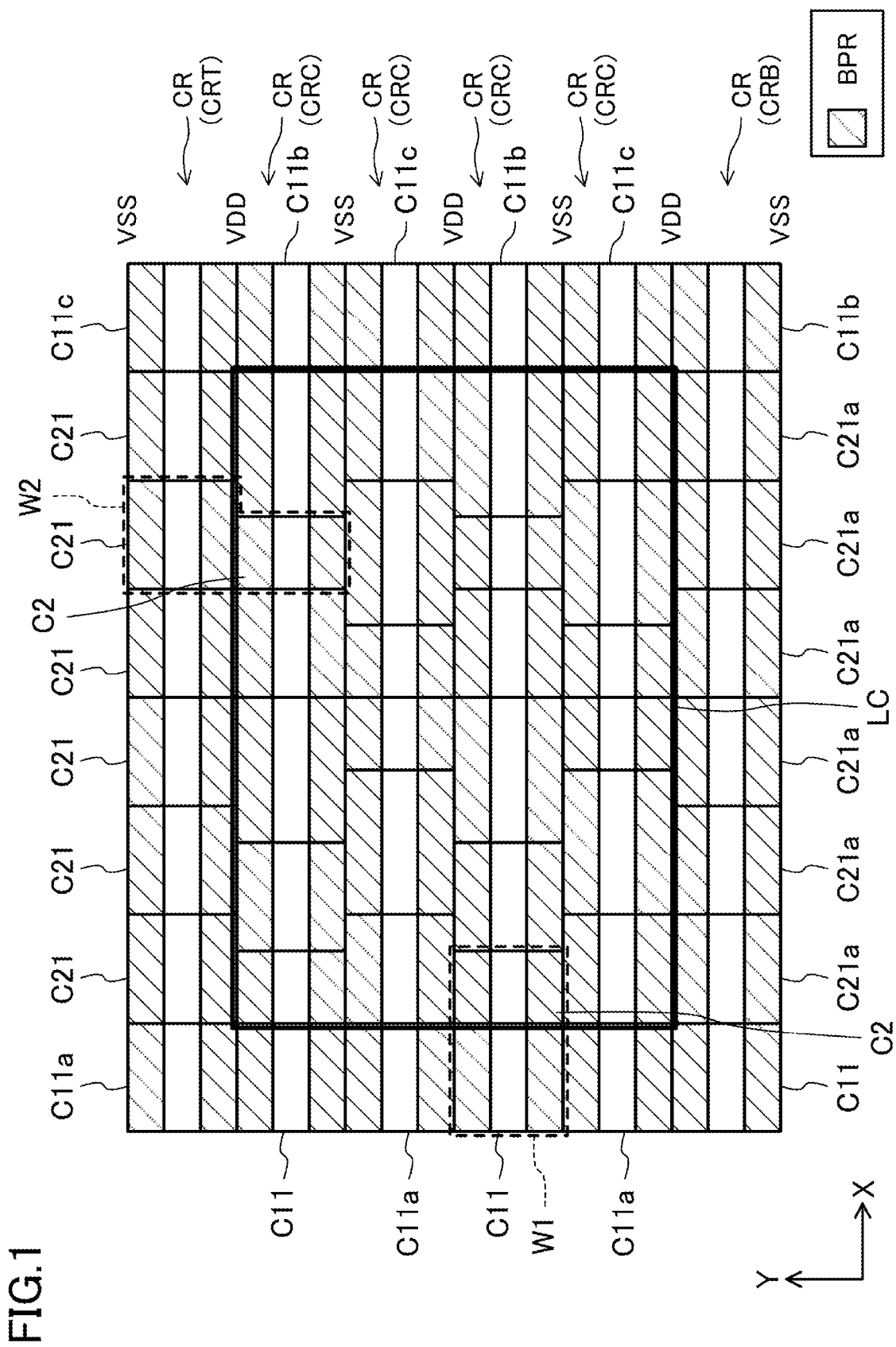
FIG. 1 is a plan view showing an example of the layout structure of a circuit block using standard cells.

Embodiments of the present disclosure will be described hereinafter with reference to the accompanying drawings. In the following embodiments, it is assumed that the semiconductor integrated circuit device includes a plurality of standard cells (hereinafter simply called cells as appropriate), and at least some of the plurality of standard cells include forksheet transistors having a fork-shaped gate electrode, among nanosheet FETs (nanowire FETs). The nanosheet FET is a FET using a thin sheet (nanosheet) through which a current flows. Such a nanosheet is formed of silicon, for example. In the semiconductor integrated circuit device, it is assumed that some of the nanosheet FETs are forksheet FETs having a fork-shaped gate electrode.

In the present disclosure, a semiconductor layer portion formed on each end of a nanosheet to constitute a terminal that is to be the source or drain of a nanosheet FET is called a "pad." Also, in the following description, in the plan views such as FIG. 1, the horizontal direction is called an X direction (corresponding to the first direction), the vertical direction is called a Y direction (corresponding to the second direction), and the direction perpendicular to the substrate plane is called a Z direction (corresponding to the third direction).

(Structure of Forksheet)

FIGS. 15A-15B are views showing a basic structure of a forksheet FET, where FIG. 15A is a plan view and FIG. 15B is a cross-sectional view taken along line Y-Y' in FIG. 15A. In the basic structure of FIGS. 15A-15B, two transistors TR1 and TR2 are placed side by side with space S between them in the Y direction. A gate interconnect 531 that is to be the gate of the transistor TR1 and a gate interconnect 532 that is to be the gate of the transistor TR2 extend in the Y direction and are at the same position in the X direction.

A channel portion 521 that is to be the channel region of the transistor TR1 and a channel portion 526 that is to be the channel region of the transistor TR2 are constituted by nanosheets. In FIGS. 15A-15B, the channel portions 521 and 526 are each constituted by three nanosheets overlapping one another as viewed in plan. Pads 522a and 522b that are to be the source and drain regions of the transistor TR1 are formed on both sides of the channel portion 521 in the X direction. Pads 527a and 527b that are to be the source and drain regions of the transistor TR2 are formed on both sides of the channel portion 526 in the X direction. The pads 522a and 522b are formed by epitaxial growth from the nanosheets constituting the channel portion 521. The pads 527a and 527b are formed by epitaxial growth from the nanosheets constituting the channel portion 526.

The gate interconnect 531 surrounds the peripheries of the nanosheets constituting the channel portion 521 in the Y and Z directions via a gate insulating film (not shown). Note however that the faces of the nanosheets constituting the channel portion 521 on the side closer to the transistor TR2 in the Y direction are exposed, not covered with the gate interconnect 531. That is, in the cross-sectional view of FIG. 15B, the gate interconnect 531 does not cover the right side faces of the nanosheets constituting the channel portion 521 but covers the upper, lower, and left side faces of the nanosheets. The gate interconnect 531 protrudes from the nanosheets constituting the channel portion 521 by a length OL on the side away from the transistor TR2 in the Y direction.

The gate interconnect 532 surrounds the peripheries of the nanosheets constituting the channel portion 526 in the Y and Z directions via a gate insulating film (not shown). Note that the faces of the nanosheets constituting the channel portion 526 on the side closer to the transistor TR1 in the Y direction are exposed, not covered with the gate interconnect 532. That is, in the cross-sectional view of FIG. 15B, the gate interconnect 532 does not cover the left side faces of the nanosheets constituting the channel portion 526 but covers the upper, lower, and right side faces of the nanosheets. The gate interconnect 532 protrudes from the nanosheets constituting the channel portion 526 by a length OL on the side away from the transistor TR1 in the Y direction.

Here, the gate effective width Weff of each nanosheet is represented by $$W\text{eff} = 2 \times W + H$$

where W is the width (size in the Y direction) of the nanosheet, and H is the height (size in the Z direction) thereof. Since the channel portions 521 and 526 of the transistors TR1 and TR2 are each constituted by three nanosheets, the gate effective width of each of the transistors TR1 and TR2 is $$3 \times (2 \times W + H).$$

In the structure of FIGS. 15A-15B, the gate interconnect 531 does not protrude from the nanosheets constituting the channel portion 521 on the side closer to the transistor TR2 in the Y direction. Also, the gate interconnect 532 does not protrude from the nanosheets constituting the channel portion 526 on the side closer to the transistor TR1 in the Y direction. This makes it possible to bring the transistors TR1 and TR2 closer to each other and thus achieve area reduction.

The number of nanosheets constituting the channel portion of each transistor is not limited to three. The channel portion may be constituted by one nanosheet, or may be constituted by a plurality of nanosheets overlapping each other as viewed in plan. Also, while the cross-sectional shape of the nanosheets is illustrated as rectangular in FIG. 15B, it is not limited to this. For example, the shape may be square, circular, or oval.

The semiconductor integrated circuit device may include both forksheet FETs and another type of nanosheet FETs where a gate interconnect surrounds the entire peripheries of nanosheets, in a mixed manner.

As used herein, "VDD" and "VSS" indicate the power supply voltages or the power supplies themselves. Also, as used herein, an expression indicating that widths, etc. are identical, such as the "same wiring width," is to be understood as including a range of manufacturing variations.

In the plan views and the cross-sectional views in the following embodiments, illustration of various insulating films may be omitted in some cases. Also, nanosheets and pads on both ends of the nanosheets may be illustrated in simplified linear shapes in some cases.

The source and drain of a transistor is herein called the "nodes" of the transistor as appropriate. That is, one node of a transistor refers to the source or drain of the transistor, and both nodes of a transistor refer to the source and drain of the transistor.

In the following embodiments and alterations, like components are denoted by the same reference characters and description thereof may be omitted in some cases.

(Configuration of Circuit Block)

FIG. 1 is a plan view showing a layout structure of a circuit block using standard cells. FIG. 1 shows only power supply lines placed across the standard cells, omitting the other components. Note that the solid lines drawn to surround cells in the plan views such as FIG. 1 define the bounds of the cells (the outer rims of inverter cells C2, etc.).

In the layout of FIG. 1, a plurality of cells arranged in the X direction constitute a cell row CR. A plurality of such cell rows CR (six rows in FIG. 1) are arranged in the Y direction. In each cell, power supply lines are formed along both ends of the cell in the Y direction, and each cell receives power supply potentials VDD and VSS from outside through these power supply lines. The entire cells are inverted in the Y direction every cell row so that the power supply lines for supply of the power supply potentials VDD and VSS are in inverted positions in the Y direction every cell row.

The plurality of cells in FIG. 1 include cells having a logical function (e.g., inverter cells C2) and terminal cells having no logical function (e.g., terminal cells C11).

In the present disclosure, a cell having a logical function such as a NAND gate and a NOR gate within the cell, like the inverter cells C2, is called a "logical cell" as appropriate.

Also, in the present disclosure, the "terminal cell" refers to a cell placed at a terminal of a circuit block without contribution to any logical function of the circuit block. The "terminals of a circuit block" as used herein refer to both ends of cell rows constituting the circuit block (both ends in the X direction in the illustrated example) and the uppermost and lowermost rows of the circuit block (the cell rows on both ends in the Y direction in the illustrated example). That is, terminal cells are placed on both ends of the cell rows in the X direction and in the cell rows on both ends in the Y direction, which are terminals of the circuit block. With placement of such terminal cells, it is possible to control variations in the finished shape of the layout pattern of cells located inside with respect to the terminal cells, and thus achieve control of variations in the manufacture, and improvement in the yield and reliability, of the semiconductor integrated circuit device.

Also, in the present disclosure, dummy gate interconnects are placed in the terminal cells. The "dummy gate interconnect" as used herein refers to a gate interconnect that does not form a transistor, or to a gate interconnect that forms a transistor that does not contribute to a logical function of a circuit.

In the present disclosure, also, each nanosheet placed in a standard cell has an exposed portion on its periphery in some cases. The "exposed portion" as used herein refers to a portion of the nanosheet exposed from a gate interconnect (a portion that is not covered with a gate interconnect) without being surrounded by a gate interconnect or a dummy gate interconnect on the periphery of the nanosheet in the Y and Z directions.

In the layout of FIG. 1, a logical part LC is formed in the center portion of the circuit block (specifically, the portion surrounded by the bold solid line in FIG. 1). The logical part LC includes logical cells having a logical function, implementing the circuit function of the circuit block. A terminal cell part is formed along the perimeter of the circuit block to surround the logical part LC.

In FIG. 1, the inverter cells C2 are placed in the logical part LC, and terminal cells C11, C11a to C11c, C21, and C21a are placed in the terminal cell part. The terminal cells C11a, C11b, and C11c are ones inverted from the terminal cells C11 in the Y direction, in the X direction, and in the X and Y directions, respectively. The terminal cells C21a are ones inverted from the terminal cells C21 in the Y direction.

In an uppermost cell row CRT of the circuit block, the terminal cell C11a is placed at the left end and the terminal cell C11c is placed at the right end as viewed in the figure, with a plurality of terminal cells C21 arranged in the X direction between the terminal cells C11a and C11c. In a lowermost cell row CRB of the circuit block, the terminal cell C11 is placed at the left end and the terminal cell C11b is placed at the right end as viewed in the figure, with a plurality of terminal cells C21a arranged in the X direction between the terminal cells C11 and C11b.

Between the cell rows CRT and CRB, cell rows CRC are placed, in which cell rows CRC each having the terminal cells C11 and C11b placed at the left and right ends, respectively, in the figure and cell rows CRC each having the terminal cells C11a and C11c placed at the left and right ends, respectively, in the figure are placed alternately in the Y direction.

In FIG. 1, therefore, terminal cells similar in configuration to the terminal cells C11 are placed along the left and right ends of the logical part LC in the figure, and terminal cells similar in configuration to the terminal cells C21 are placed along the upper and lower ends of the logical part LC in the figure.

(Layout Structure of Logical Cell)

Figure 2:
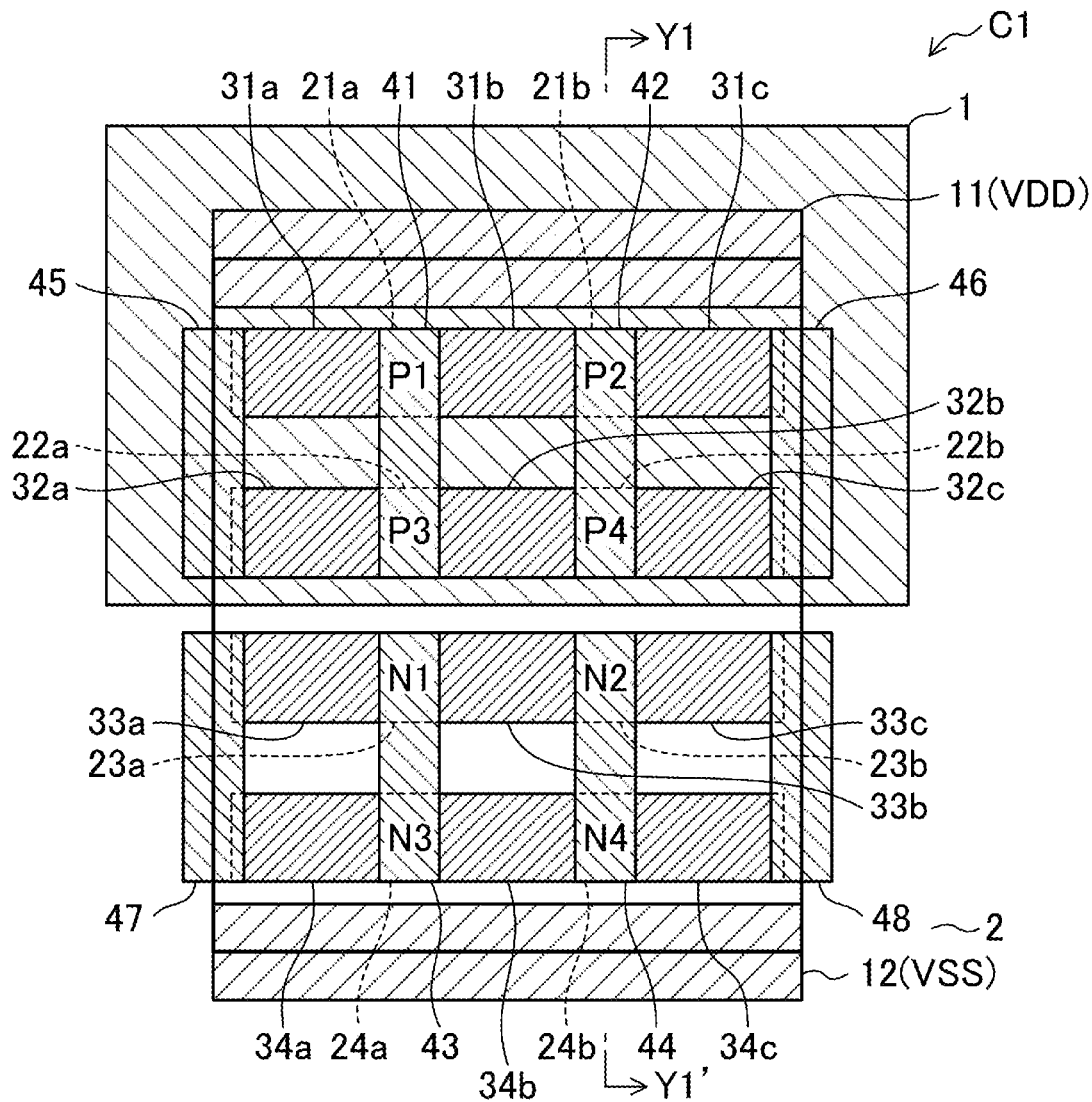
FIG. 2 is a plan view showing a layout structure of a logical cell.

FIG. 2 is a plan view showing a layout structure of a logical cell, and FIG. 3 is a cross-sectional view of the layout structure of the logical cell. Specifically, FIG. 3 shows a cross section taken along line Y1-Y1' in FIG. 2.

As shown in FIG. 2, in a standard cell C1 formed are an N-well region 1 expanding in the X direction from the center over the upper part in the figure and a P-substrate region 2 expanding in the X direction from the center over the lower part in the figure.

Also formed are power supply lines 11 and 12 extending in the X direction along both ends of the cell in the Y direction. Both the power supply lines 11 and 12 are buried power rails (BPRs) formed in a buried interconnect layer: the power supply line 11, formed in the N-well region 1, supplies a power supply voltage VDD, and the power supply line 12, formed in the P-substrate region 2, supplies a power supply voltage VSS.

Nanosheets 21a to 24a and 21b to 24b expanding in the X and Y directions are formed in the standard cell C1. The nanosheets 21a and 21b are formed side by side in the X direction, the nanosheets 22a and 22b are formed side by side in the X direction, the nanosheets 23a and 23b are formed side by side in the X direction, and the nanosheets 24a and 24b are formed side by side in the X direction.

The nanosheets 21a and 22a overlap a gate interconnect 41 as viewed in plan, the nanosheets 21b and 22b overlap a gate interconnect 42 as viewed in plan, the nanosheets 23a and 24a overlap a gate interconnect 43 as viewed in plan, and the nanosheets 23b and 24b overlap a gate interconnect 44 as viewed in plan.

The nanosheets 21a, 21b, 22a, and 22b constitute the channel portions of transistors P1 to P4, respectively. The nanosheets 23a, 23b, 24a, and 24b constitute the channel portions of transistors N1 to N4, respectively.

Pads 31a to 31c and 32a to 32c doped with a p-type semiconductor are formed on the left side of the nanosheets 21a, between the nanosheets 21a and 21b, on the right side of the nanosheets 21b, on the left side of the nanosheets 22a, between the nanosheets 22a and 22b, and on the right side of the nanosheets 22b, respectively, as viewed in the figure.

Pads 33a to 33c and 34a to 34c doped with an n-type semiconductor are formed on the left side of the nanosheets 23a, between the nanosheets 23a and 23b, on the right side of the nanosheets 23b, on the left side of the nanosheets 24a, between the nanosheets 24a and 24b, and on the right side of the nanosheets 24b, respectively, as viewed in the figure.

The pads 31a and 31b constitute the nodes of the transistor P1, the pads 31b and 31c constitute the nodes of the transistor P2, the pads 32a and 32b constitute the nodes of the transistor P3, and the pads 32b and 32c constitute the nodes of the transistor P4. The pads 33a and 33b constitute the nodes of the transistor N1, the pads 33b and 33c constitute the nodes of the transistor N2, the pads 34a and 34b constitute the nodes of the transistor N3, and the pads 34b and 34c constitute the nodes of the transistor N4.

The gate interconnects 41 to 44 and dummy gate interconnects 45 to 48 extending in the Y and Z directions are formed in the standard cell C1. Specifically, the dummy gate interconnect 45, the gate interconnects 41 and 42, and the dummy gate interconnect 46 are arranged at an equal pitch in the X direction, and the dummy gate interconnect 47, the gate interconnects 43 and 44, and the dummy gate interconnect 48 are arranged at an equal pitch in the X direction. The dummy gate interconnects 45 and 47 are formed along the left end of the standard cell C1, and the dummy gate interconnects 46 and 48 are formed along the right end of the standard cell C1, as viewed in the figure.

The gate interconnect 41 is to be the gates of the transistors P1 and P3, the gate interconnect 42 is to be the gates of the transistors P2 and P4, the gate interconnect 43 is to be the gates of the transistors N1 and N3, and the gate interconnect 44 is to be the gates of the transistors N2 and N4.

That is, the transistor P1 is constituted by the nanosheets 21a, the pads 31a and 31b, and the gate interconnect 41. The transistor P2 is constituted by the nanosheets 21b, the pads 31b and 31c, and the gate interconnect 42. The transistor P3 is constituted by the nanosheets 22a, the pads 32a and 32b, and the gate interconnect 41. The transistor P4 is constituted by the nanosheets 22b, the pads 32b and 32c, and the gate interconnect 42. The transistor N1 is constituted by the nanosheets 23a, the pads 33a and 33b, and the gate interconnect 43. The transistor N2 is constituted by the nanosheets 23b, the pads 33b and 33c, and the gate interconnect 44. The transistor N3 is constituted by the nanosheets 24a, the pads 34a and 34b, and the gate interconnect 43. The transistor N4 is constituted by the nanosheets 24b, the pads 34b and 34c, and the gate interconnect 44.

As shown in FIG. 3, the nanosheets 21b to 24b are each composed of three sheet-shaped semiconductor layers (nanosheets). The three nanosheets of each of the nanosheets 21b to 24b are placed to overlap one another as viewed in plan and spaced from one another in the Z direction. Although illustration is omitted, the nanosheets 21a to 24a are also each composed of three sheet-shaped semiconductor layers, like the nanosheets 21b to 24b. That is, the transistors P1 to P4 and N1 to N4 each include three nanosheets.

As shown in FIG. 3, each of the nanosheets 21b to 24b has an exposed portion (a portion that is not surrounded by a gate interconnect) on its periphery in the Y and Z directions. Specifically, the left side faces of the nanosheets 21b are not covered with the gate interconnect 42, and the right side faces of the nanosheets 22b are not covered with the gate interconnect 42, as viewed in the figure. The left side faces of the nanosheets 23b are not covered with the gate interconnect 44, and the right side faces of the nanosheets 24b are not covered with the gate interconnect 44, as viewed in the figure.

That is, the nanosheets 21b and 23b each have an exposed portion on the left side in the figure (on the upper side in FIG. 2), and the nanosheets 22b and 24b each have an exposed portion on the right side in the figure (on the lower side in FIG. 2). Similarly, in FIG. 2, the nanosheets 21a and 23a each have an exposed portion on the upper side, and the nanosheets 22a and 24a each have an exposed portion on the lower side.

In other words, the faces of the nanosheets 21a, 21b, 23a, and 23b on the same side (on the upper side in FIG. 2) are exposed from the gate interconnects, and the faces of the nanosheets 22a, 22b, 24a, and 22b on the same side (on the lower side in FIG. 2) are exposed from the gate interconnects.

The nanosheets 21a and 21b are aligned at their upper ends in the Y direction, and the nanosheets 22a and 22b are aligned at their lower ends in the Y direction, as viewed in the figure. The nanosheets 23a and 23b are aligned at their upper ends in the Y direction, and the nanosheets 24a and 24b are aligned at their lower ends in the Y direction, as viewed in the figure.

Also, the gate interconnects 41 and 42 and the dummy gate interconnects 45 and 46 are aligned at their upper and lower ends in the Y direction, and the gate interconnects 43 and 44 and the dummy gate interconnects 47 and 48 are aligned at their upper and lower ends in the Y direction, as viewed in the figure.

(Specific Example of Logical Cell)

Figure 5A:
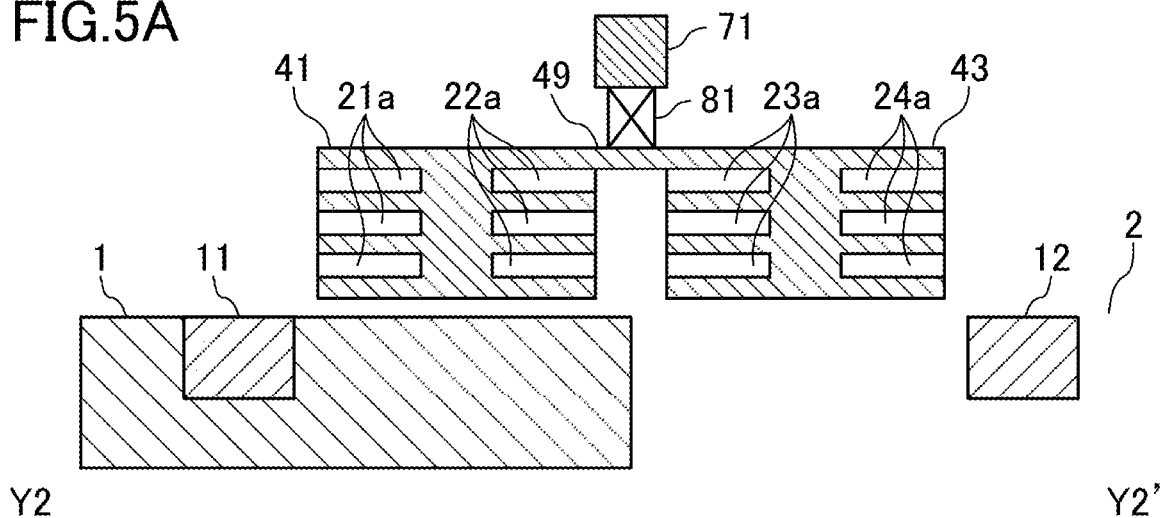
FIGS. 5A-5B are cross-sectional views of a specific example of the layout structure of the logical cell.
Figure 5B:
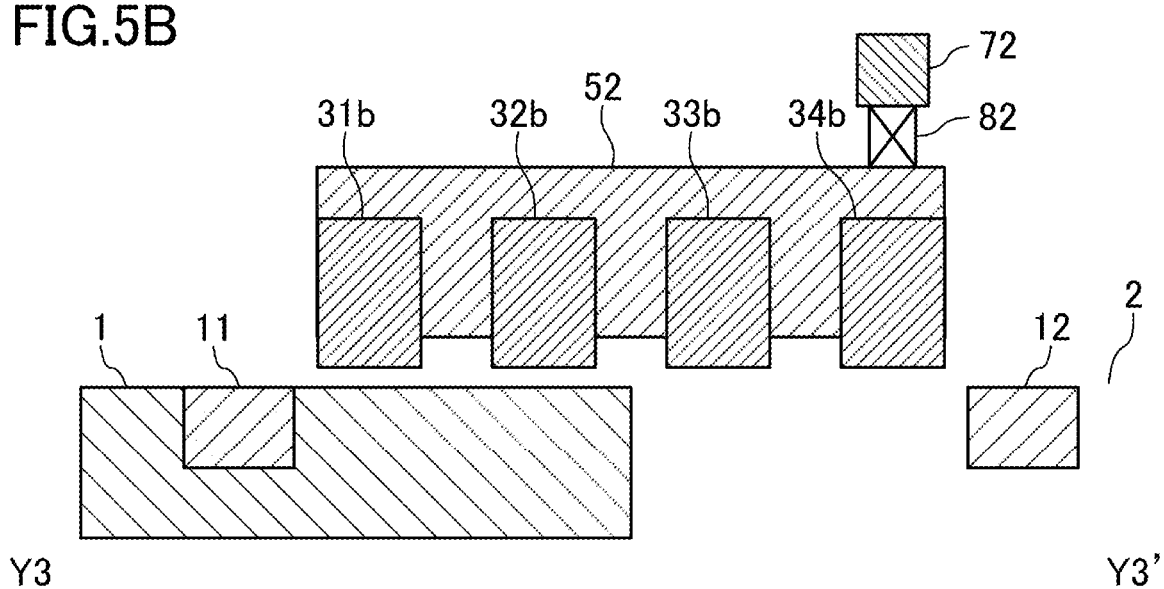
Figure 6B:
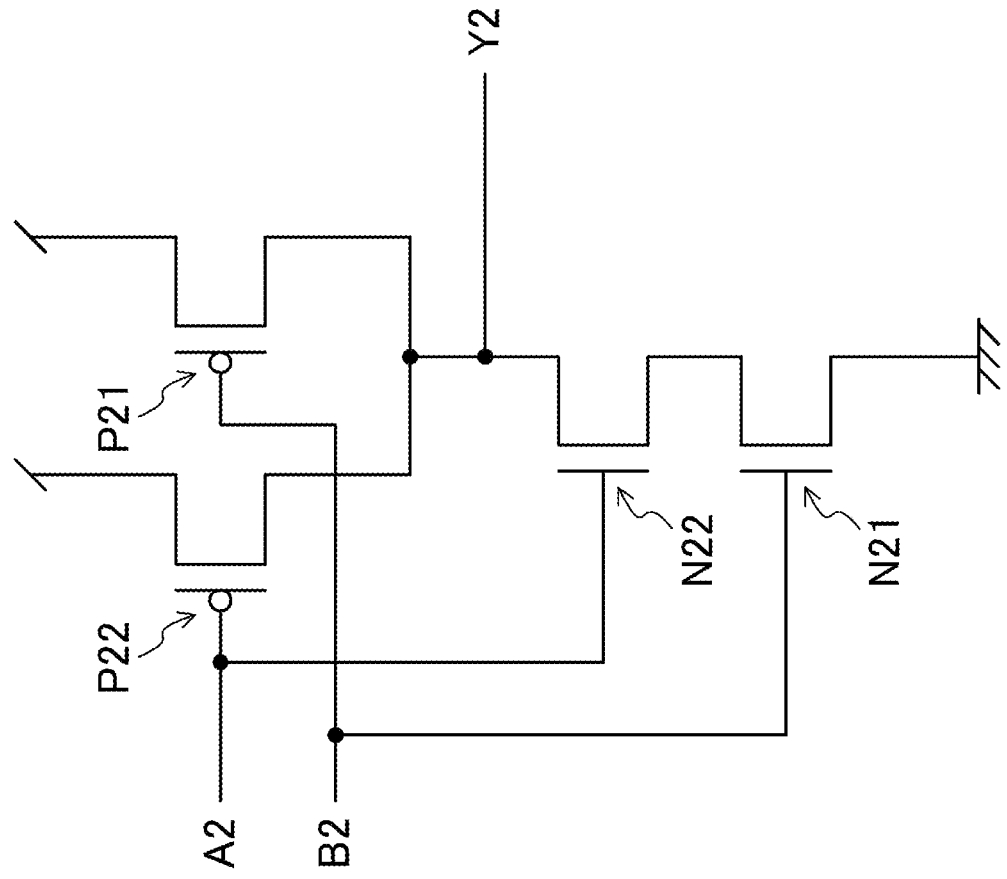
FIGS. 6A-6B are circuit diagrams configured in the logical cells.
Figure 6A:
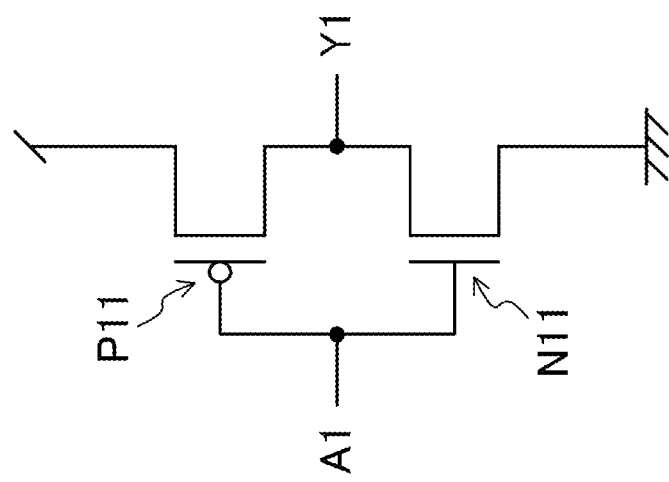

FIGS. 4A-4B are plan views showing specific examples of the layout structure of the logical cell. FIGS. 5A-5B are cross-sectional views of a specific example of the layout structure of the logical cell. FIGS. 6A-6B are circuit diagrams configured in the logical cells. Specifically, FIG. 4A shows a layout structure of an inverter cell C2, and FIG. 4B shows a layout structure of a NAND cell C3. FIG. 5A shows a cross section taken along line Y2-Y2' in FIG. 4A, and FIG. 5B shows a cross section taken along line Y3-Y3' in FIG. 4A. FIG. 6A is a circuit diagram configured in the inverter cell C2 shown in FIG. 4A, and FIG. 6B is a circuit diagram configured in the NAND cell C3 shown in FIG. 4B.

First, the layout structure of the inverter cell C2 will be described.

As shown in FIG. 6A, in the inverter cell C2, configured is an inverter circuit having transistors P11 and N11, an input A1, and an output Y1. The transistors P11 and N11 are each constituted by two transistors although illustration is omitted in FIG. 6A. Incidentally, the transistors P1 and P3 correspond to the transistor P11, and the transistors N1 and N3 correspond to the transistor N11. Also, interconnects 71 and 72 correspond to the input A1 and the output Y1, respectively.

As shown in FIGS. 4A, 5A, and 5B, the inverter cell C2 is small in cell width (the size of the cell in the X direction), compared to the standard cell C1, where none of the transistors P2, P4, N2, and N4 are formed.

Specifically, any of the nanosheets 21b to 24b, the pads 31c to 34c, and the gate interconnects 42 and 44 are not formed in the inverter cell C2. Also, the gate interconnects 41 and 43 are mutually connected through a gate connector 49.

Local interconnects 51 to 53 extending in the Y direction are formed above the pads 31a to 34a and 31b to 34b. The local interconnect 51 is connected with the pads 31a and 32a, the local interconnect 52 is connected with the pads 31b to 34b, and the local interconnect 53 is connected with the pads 33a and 34a.

The local interconnect 51 is connected with the power supply line 11 through a contact 61, and the local interconnect 53 is connected with the power supply line 12 through a contact 62.

The interconnects 71 and 72 extending in the X direction are formed in a first metal interconnect layer located above the local interconnects 51 to 53. The interconnect 71 is connected with the gate connector 49 through a contact 81, and the interconnect 72 is connected with the local interconnect 52 through a contact 82.

Next, the layout structure of the NAND cell C3 will be described.

As shown in FIG. 6B, in the NAND cell C3, configured is a 2-input NAND circuit having transistors P21, P22, N21, and N22, inputs A2 and B2, and an output Y2. The transistors P21, P22, N21, and N22 are each constituted by two transistors although illustration is omitted in FIG. 6B. Incidentally, the transistors P1 and P3 correspond to the transistor P21, the transistors P2 and P4 correspond to the transistor P22, the transistors N1 and N3 correspond to the transistor N21, and the transistors N2 and N4 correspond to the transistor N22. Also, interconnects 73 to 75 correspond to the output Y2 and the inputs B2 and A2, respectively.

As shown in FIG. 4B, in the NAND cell C3, the gate interconnects 41 and 43 are mutually connected through a gate connector 49, and the gate interconnects 42 and 44 are mutually connected through a gate connector 50.

Local interconnects 54 to 58 extending in the Y direction are formed above the pads 31a to 34a, 31b to 34b, and 31c to 34c. The local interconnect 54 is connected with the pads 31a and 32a, the local interconnect 55 is connected with the pads 31b and 32b, the local interconnect 56 is connected with the pads 31c to 34c, the local interconnect 57 is connected with the pads 33a and 34a, and the local interconnect 58 is connected with the pads 33b and 34b.

The local interconnect 55 is connected with the power supply line 11 through a contact 63, and the local interconnect 57 is connected with the power supply line 12 through a contact 64.

The interconnects 73 to 75 extending in the X direction are formed in a first metal interconnect layer located above the local interconnects 54 to 58. The interconnect 73 is connected with the local interconnect 54 through a contact 83 and also connected with the local interconnect 56 through a contact 84. The interconnect 74 is connected with the gate connector 49 through a contact 85, and the interconnect 75 is connected with the gate connector 50 through a contact 86.

First Embodiment

Figure 7:
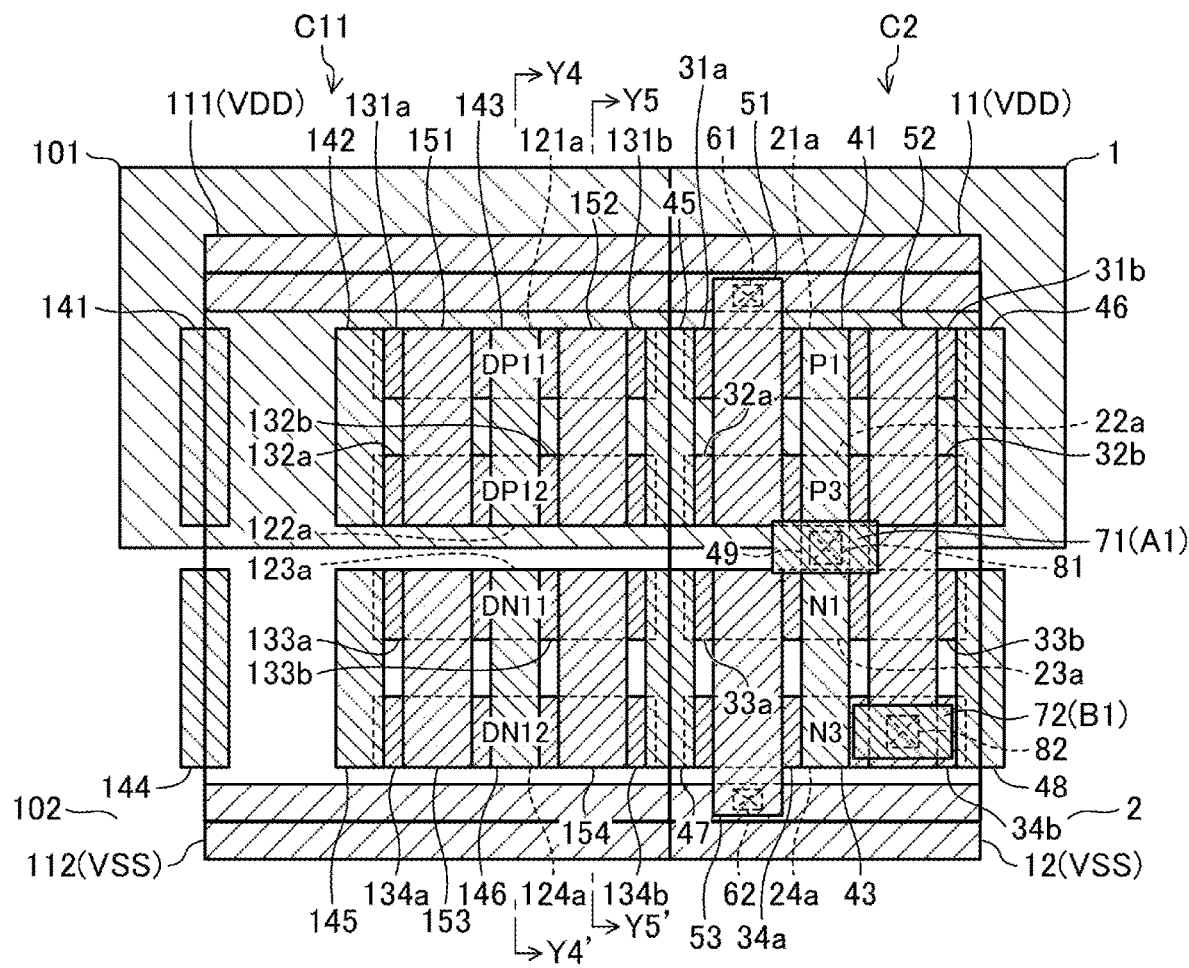
FIG. 7 is a plan view showing a layout structure of a semiconductor integrated circuit device according to the first embodiment.

FIG. 7 is a plan view showing a layout structure of a semiconductor integrated circuit device according to the first embodiment, and FIGS. 8A-8B are cross-sectional views of the layout structure of the semiconductor integrated circuit device according to the first embodiment. Specifically, FIG. 7 is an enlarged view of a portion W1 in FIG. 1, FIG. 8A shows a cross section taken along line Y4-Y4' in FIG. 7, and FIG. 8B shows a cross section taken along line Y5-Y5' in FIG. 7.

As shown in FIGS. 1 and 7, a terminal cell C11 is placed on the left side of an inverter cell C2 adjacently at the left end of a cell row CR as viewed in the figure.

Specifically, in the terminal cell C11 formed are an N-well region 101 expanding in the X direction from the center over the upper part in the figure and a P-substrate region 102 expanding in the X direction from the center over the lower part in the figure.

Also formed are power supply lines 111 and 112 extending in the X direction along both ends of the cell in the Y direction. Both the power supply lines 111 and 112 are buried power rails (BPRs) formed in a buried interconnect layer: the power supply line 111, formed in the N-well region 101, supplies the power supply voltage VDD, and the power supply line 112, formed in the P-substrate region 102, supplies the power supply voltage VSS.

Nanosheets 121a to 124a expanding in the X and Y directions are formed in the terminal cell C11.

The nanosheets 121a and 122a overlap a dummy gate interconnect 143 as viewed in plan, and the nanosheets 123a and 124a overlap a dummy gate interconnect 146 as viewed in plan. The nanosheets 121a to 124a constitute the channel portions of dummy transistors DP11, DP12, DN11, and DN12, respectively.

Dummy pads 131a, 131b, 132a, and 132b doped with a p-type semiconductor are formed on the left side of the nanosheets 121a, on the right side of the nanosheets 121a, on the left side of the nanosheets 122a, and on the right side of the nanosheets 122a, respectively.

Dummy pads 133a, 133b, 134a, and 134b doped with an n-type semiconductor are formed on the left side of the nanosheets 123a, on the right side of the nanosheets 123a, on the left side of the nanosheets 124a, and on the right side of the nanosheets 124a, respectively.

The dummy pads 131a and 131b constitute the nodes of the dummy transistor DP11, the dummy pads 132a and 132b constitute the nodes of the dummy transistor DP12, the dummy pads 133a and 133b constitute the nodes of the dummy transistor DN11, and the dummy pads 134a and 134b constitute the nodes of the dummy transistor DN12.

Dummy gate interconnects 141 to 146 extending in the Y and Z directions are formed in the terminal cell C11. The dummy gate interconnects 141 and 144 are formed along the left end of the terminal cell C11 in the figure. The dummy gate interconnects 45 and 47 are formed along the cell boundary between the terminal cell C11 and the inverter cell C2. The dummy gate interconnect 143 is to be the gates of the dummy transistors DP11 and DP12, and the dummy gate interconnect 146 is to be the gates of the dummy transistors DN11 and DN12.

Local interconnects 151 to 154 extending in the Y direction are formed above the dummy pads 131a to 134a and 131b to 134b. The local interconnect 151 is connected with the dummy pads 131a and 132a, the local interconnect 152 is connected with the dummy pads 131b and 132b, the local interconnect 153 is connected with the dummy pads 133a and 134a, and the local interconnect 154 is connected with the dummy pads 133b and 134b.

As shown in FIG. 8A, each of the nanosheets 121a to 124a has an exposed portion (a portion that is not surrounded by a dummy gate interconnect) on its periphery in the Y and Z directions. Specifically, the left side faces of the nanosheets 121a are not covered with the dummy gate interconnect 143, and the right side faces of the nanosheets 122a are not covered with the dummy gate interconnect 143, as viewed in the figure. The left side faces of the nanosheets 123a are not covered with the dummy gate interconnect 146, and the right side faces of the nanosheets 124a are not covered with the dummy gate interconnect 146, as viewed in the figure.

That is, the nanosheets 121a and 123a each have an exposed portion on the left side in the figure (on the upper side in FIG. 7), and the nanosheets 122a and 124a each have an exposed portion on the right side in the figure (on the lower side in FIG. 7).

In other words, the faces of the nanosheets 121a on the same side as the exposed faces of the nanosheets 21a of the inverter cell C2 (on the upper side in FIG. 7) are exposed from the dummy gate interconnect 143. The faces of the nanosheets 122a on the same side as the exposed faces of the nanosheets 22a of the inverter cell C2 (on the lower side in FIG. 7) are exposed from the dummy gate interconnect 143. The faces of the nanosheets 123a on the same side as the exposed faces of the nanosheets 23a of the inverter cell C2 (on the upper side in FIG. 7) are exposed from the dummy gate interconnect 146. The faces of the nanosheets 124a on the same side as the exposed faces of the nanosheets 24a of the inverter cell C2 (on the lower side in FIG. 7) are exposed from the dummy gate interconnect 146.

In FIG. 7, the nanosheets 121a to 124a are formed in the same layer as the nanosheets 21a to 24a.

The nanosheets 121a are formed at the same position as the nanosheets 21a in the Y direction, the nanosheets 122a are formed at the same position as the nanosheets 22a in the Y direction, the nanosheets 123a are formed at the same position as the nanosheets 23a in the Y direction, and the nanosheets 124a are formed at the same position as the nanosheets 24a in the Y direction.

The nanosheets 121a are aligned with the nanosheets 21a at their upper ends in the Y direction in the figure, and the nanosheets 122a are aligned with the nanosheets 22a at their lower ends in the Y direction in the figure. The nanosheets 123a are aligned with the nanosheets 23a at their upper ends in the Y direction in the figure, and the nanosheets 124a are aligned with the nanosheets 24a at their lower ends in the Y direction in the figure.

Also, the dummy pads 131a to 134a and 131b to 134b are formed in the same layer as the pads 31a to 34a and 31b to 34b.

The dummy pads 131a and 131b are formed at the same position as the pads 31a and 31b in the Y direction, the dummy pads 132a and 132b are formed at the same position as the pads 32a and 32b in the Y direction, the dummy pads 133a and 133b are formed at the same position as the pads 33a and 33b in the Y direction, and the dummy pads 134a and 134b are formed at the same position as the pads 34a and 34b in the Y direction.

The dummy pads 131a and 131b and the pads 31a and 31b are placed at an equal pitch in the X direction, the dummy pads 132a and 132b and the pads 32a and 32b are placed at an equal pitch in the X direction, the dummy pads 133a and 133b and the pads 33a and 33b are placed at an equal pitch in the X direction, and the dummy pads 134a and 134b and the pads 34a and 34b are placed at an equal pitch in the X direction.

Also, the dummy gate interconnects 141 to 146 are formed in the same layer as the gate interconnects 41 and 43 and the dummy gate interconnects 45 to 48.

The dummy gate interconnects 141 to 143 are formed at the same position as the gate interconnect 41 and the dummy gate interconnects 45 and 46 in the Y direction. The dummy gate interconnects 144 to 146 are formed at the same position as the gate interconnect 43 and the dummy gate interconnects 47 and 48 in the Y direction.

The dummy gate interconnects 141 to 143 and 45, the gate interconnect 41, and the dummy gate interconnect 46 are placed at an equal pitch in the X direction, and the dummy gate interconnects 144 to 146 and 47, the gate interconnect 43, and the dummy gate interconnect 48 are placed at an equal pitch in the X direction.

The dummy gate interconnects 141 to 143 are aligned with the gate interconnect 41 and the dummy gate interconnects 45 and 46 at their upper and lower ends in the Y direction in the figure. The dummy gate interconnects 144 to 146 are aligned with the gate interconnect 43 and the dummy gate interconnects 47 and 48 at their upper and lower ends in the Y direction in the figure.

Also, the local interconnects 151 to 154 are formed in the same layer as the local interconnects 51 to 53.

The local interconnects 151, 152, 51, and 52 are placed at an equal pitch in the X direction, and the local interconnects 153, 154, 53, and 52 are placed at an equal pitch in the X direction.

With the above configuration, the semiconductor integrated circuit device includes a plurality of cell rows CR each having a plurality of standard cells arranged in the X direction. A cell row CR includes an inverter cell C2 having a logical function and a terminal cell C11 placed at the left end of the cell row CR in the figure. The terminal cell C11 is placed on the left side of the inverter cell C2 adjacently at the left end of the cell row CR in the figure. The inverter cell C2 includes: the N-well region 1 that is a region for formation of p-type transistors; the P-substrate region 2 that is a region for formation of n-type transistors; the nanosheets 22a extending in the X direction, formed in the N-well region 1; the nanosheets 23a extending in the X direction, formed in the P-substrate region 2; the gate interconnect 41 extending in the Y direction, surrounding the peripheries of the nanosheets 22a in the Y and Z directions; and the gate interconnect 43 extending in the Y direction, surrounding the peripheries of the nanosheets 23a in the Y and Z directions. The terminal cell C11 includes: the nanosheets 122a extending in the X direction, formed at the same position as the nanosheets 22a in the Y direction; the nanosheets 123a extending in the X direction, formed at the same position as the nanosheets 23a in the Y direction; the dummy gate interconnect 143 extending in the Y direction, surrounding the peripheries of the nanosheets 122a in the Y and Z directions; and the dummy gate interconnect 146 extending in the Y direction, surrounding the peripheries of the nanosheets 123a in the Y and Z directions. The faces of the nanosheets 22a on the lower side in the figure are exposed from the gate interconnect 41, and the faces of the nanosheets 23a on the upper side in the figure are exposed from the gate interconnect 43. The faces of the nanosheets 122a on the lower side in the figure are exposed from the dummy gate interconnect 143, and the faces of the nanosheets 123a on the upper side in the figure are exposed from the gate interconnect 146.

That is, in the nanosheets 22a and 122a placed at the same position in the Y direction, their faces on the same side in the Y direction are exposed from the gate interconnect 41 and the dummy gate interconnect 143, respectively. In the nanosheets 23a and 123a placed at the same position in the Y direction, their faces on the same side in the Y direction are exposed from the gate interconnect 43 and the dummy gate interconnect 146, respectively. This makes it possible to achieve control of variations in the manufacture, and improvement in the yield and reliability, of the semiconductor integrated circuit device.

Also, the faces of the nanosheets 22a and 23a opposed to each other are exposed from the gate interconnects 41 and 43, respectively. The faces of the nanosheets 122a and 123a opposed to each other are exposed from the dummy gate interconnects 143 and 146, respectively. Therefore, since no protrusions of the gate interconnect and the dummy gate interconnect are necessary between the nanosheets 22a and 23a and between the nanosheets 122a and 123a, it is possible to achieve reduction in the area of the semiconductor integrated circuit device.

The inverter cell C2 also includes the nanosheets 21a and 24a that extend in the X direction and are formed in the N-well region 1 and the P-substrate region 2, respectively. The terminal cell C11 also includes the nanosheets 121a and 124a that extend in the X direction and are formed at the same positions as the nanosheets 21a and 24a, respectively, in the Y direction. The gate interconnects 41 and 43 and the dummy gate interconnects 143 and 146 surround the peripheries of the nanosheets 21a, 24a, 121a, and 124a, respectively, in the Y and Z directions. The upper faces of the nanosheets 21a are exposed from the gate interconnect 41, and the lower faces of the nanosheets 24a are exposed from the gate interconnect 43, as viewed in the figure. The upper faces of the nanosheets 121a are exposed from the dummy gate interconnect 143, and the lower faces of the nanosheets 124a are exposed from the dummy gate interconnect 146, as viewed in the figure.

That is, in the nanosheets 21a and 121a placed at the same position in the Y direction, their faces on the same side in the Y direction are exposed from the gate interconnect 41 and the dummy gate interconnect 143, respectively. In the nanosheets 24a and 124a placed at the same position in the Y direction, their faces on the same side in the Y direction are exposed from the gate interconnect 43 and the dummy gate interconnect 146, respectively. This makes it possible to achieve control of variations in the manufacture, and improvement in the yield and reliability, of the semiconductor integrated circuit device.

Also, the nanosheets 121a are aligned with the nanosheets 21a at their upper ends in the Y direction, and the nanosheets 122a are aligned with the nanosheets 22a at their lower ends in the Y direction, as viewed in the figure. The nanosheets 123a are aligned with the nanosheets 23a at their upper ends in the Y direction, and the nanosheets 124a are aligned with the nanosheets 24a at their lower ends in the Y direction, as viewed in the figure. This makes it possible to achieve control of variations in the manufacture, and improvement in the yield and reliability, of the semiconductor integrated circuit device.

The nanosheets 121a to 124a are formed in the same layer as the nanosheets 21a to 24a. The dummy pads 131a to 134a and 131b to 134b are formed in the same layer as the pads 31a to 34a and 31b to 34b. The dummy gate interconnects 141 to 146 are formed in the same layer as the gate interconnects 41 and 43 and the dummy gate interconnects 45 to 48. The local interconnects 151 to 154 are formed in the same layer as the local interconnects 51 to 53. That is, with the formation of nanosheets, dummy pads, dummy gate interconnects, and local interconnects in a terminal cell, pads including dummy pads, gate interconnects including dummy gate interconnects, and local interconnects are placed regularly. This makes it possible to control variations in the finished shape of the layout pattern of cells located inside with respect to the terminal cell, and thus achieve control of variations in the manufacture, and improvement in the yield and reliability, of the semiconductor integrated circuit device.

The dummy transistors DP11, DP12, DN11, and DN12 are placed adjacent to the dummy gate interconnects 45 and 47 lying along the boundary between the inverter cell 2 and the terminal cell C11. That is, with placement of a terminal cell having dummy transistors placed adjacent to dummy gate interconnects lying along the boundary between the terminal cell and a logical cell, it is possible to make uniform the distances from a cell placed at an end of the logical part to its nearest transistors, and thus improve the predictivity of the performance of the logical part.

The cell width of the terminal cell C11 may be larger than, or smaller than, the size illustrated in FIG. 7.

While the terminal cell C11 includes four dummy transistors, DP11, DP12, DN11, and DN12, the number of dummy transistors provided in the terminal cell C11 is not limited to four.

While the terminal cell C11 includes eight dummy gate interconnects, 45, 46, and 141 to 146, the number of dummy gate interconnects provided in the terminal cell C11 is not limited to eight.

While the terminal cell C11 includes four local interconnects, 151 to 154, the number of local interconnects provided in the terminal cell C11 is not limited to four.

In the logical cell (the inverter cell C2 in FIG. 7), three or more nanosheet FETs may be provided for one gate interconnect (or dummy gate interconnect). In this case, in the terminal cell, nanosheets may be formed at the same positions as nanosheets of the logical cell in the Y direction. At this time, when the lower faces of the nanosheets of the logical cell are exposed from the gate interconnect, the lower faces of the nanosheets of the terminal cell are also to be exposed from the dummy gate interconnect, as viewed in the figure. Conversely, when the upper faces of the nanosheets of the logical cell are exposed from the gate interconnect, the upper faces of the nanosheets of the terminal cell are also to be exposed from the dummy gate interconnect, as viewed in the figure.

(Alteration)

FIGS. 9A-9B are views showing a layout structure of a logical cell according to an alteration of the first embodiment, and FIGS. 10A-10C are views showing a layout structure of a terminal cell according to the alteration of the first embodiment. Specifically, FIG. 9A is a plan view showing a layout structure of a standard cell C4, and FIG. 9B shows a cross section taken along line Y6-Y6' in FIG. 9A. FIG. 10A is a plan view showing a layout structure of a terminal cell C12, FIG. 10B shows a cross section taken along line Y7a-Y7a' in FIG. 10A, and FIG. 10C shows a cross section taken along line Y7b-Y7b' in FIG. 10A.

In FIG. 1, when the standard cell C4 is placed instead of the inverter cell C2, the terminal cell C12 is to be placed instead of the terminal cell C11.

While two nanosheet FETs are provided for one gate interconnect for the standard cell C1 (inverter cell C2) and the terminal cell C11, one nanosheet FET is provided for one gate interconnect for the standard cell C4 and the terminal cell C12.

(Standard Cell C4)

As shown in FIG. 9A, nanosheets 22c, 22d, 23c, and 23d expanding in the X and Y directions are formed in the standard cell C4. The nanosheets 22c, 22d, 23c, and 23d overlap the gate interconnects 41 to 44, respectively. The nanosheets 22c, 22d, 23c, and 23d constitute the channel portions of transistors P5, P6, N5, and N6, respectively.

Pads 32d to 32f doped with a p-type semiconductor are formed on the left side of the nanosheets 22c, between the nanosheets 22c and 22d, and on the right side of the nanosheets 22d, respectively, as viewed in the figure.

Pads 33d to 33f doped with an n-type semiconductor are formed on the left side of the nanosheets 23c, between the nanosheets 23c and 23d, and on the right side of the nanosheets 23d, respectively, as viewed in the figure.

The pads 32d and 32e constitute the nodes of the transistor P5, the pads 32e and 32f constitute the nodes of the transistor P6, the pads 33d and 33e constitute the nodes of the transistor N5, and the pads 33e and 33f constitute the nodes of the transistor N6.

The gate interconnect 41 is to be the gate of the transistor P5, the gate interconnect 42 is to be the gate of the transistor P6, the gate interconnect 43 is to be the gate of the transistor N5, and the gate interconnect 44 is to be the gate of the transistor N6.

As shown in FIGS. 9A and 9B, each of the nanosheets 22c, 22d, 23c, and 23d has an exposed portion on its periphery in the Y and Z directions. Specifically, in FIG. 9A, an exposed portion is formed on the lower side of each of the nanosheets 22c and 22d, and an exposed portion is formed on the upper side of each of the nanosheets 23c and 23d, as viewed in the figure. That is, in the standard cell C4, the faces of the nanosheets 22c and 22d on the same side (on the lower side in FIG. 9A) are exposed from the gate interconnects, and the faces of the nanosheets 23c and 23d on the same side (on the upper side in FIG. 9A) are exposed from the gate interconnects.

Also, in FIG. 9A, the upper faces of the nanosheets 22c and 22d are covered with the gate interconnects 41 and 42, respectively, and the lower faces of the nanosheets 23c and 23d are covered with the gate interconnects 43 and 44, respectively. That is, the upper faces of the nanosheets 22c and 22d are not exposed from the gate interconnects, and the lower faces of the nanosheets 23c and 23d are not exposed from the gate interconnects.

Based on the layout structure of the standard cell C4, a standard cell implementing a logical function is provided by forming vias and interconnects (local interconnects and metal interconnects) for connection between transistors. Note that, in the following description, the standard cell C4 that has implemented a logical function by forming vias and interconnects may be called the standard cell C4 having a logical function in some cases.

(Terminal Cell C12)

As shown in FIG. 10A, nanosheets 122c and 123c expanding in the X and Y directions are formed in the terminal cell C12. The nanosheets 122c and 123c overlap the dummy gate interconnects 143 and 146, respectively. The nanosheets 122c and 123c constitute the channel portions of dummy transistors DP13 and DN13, respectively.

Dummy pads 132c and 132d doped with a p-type semiconductor are formed on the left and right sides of the nanosheets 122c, respectively, as viewed in the figure.

Dummy pads 133c and 133d doped with an n-type semiconductor are formed on the left and right sides of the nanosheets 123c, respectively, as viewed in the figure.

The dummy pads 132c and 132d constitute the nodes of the dummy transistor DP13, and the dummy pads 133c and 133d constitute the nodes of the dummy transistor DN13.

The dummy gate interconnect 143 is to be the gate of the dummy transistor DP13, and the dummy gate interconnect 146 is to be the gate of the transistor DN13.

Local interconnects 155 to 158 extending in the Y direction are formed above the dummy pads 132c, 132d, 133c, and 133d. The local interconnects 155 to 158 are connected with the dummy pads 132c, 132d, 133c, and 133d, respectively.

As shown in FIG. 10A to 10C, each of the nanosheets 122c and 123c has an exposed portion on its periphery in the Y and Z directions. Specifically, in FIG. 10A, an exposed portion is formed on the lower side of each of the nanosheets 122c, and an exposed portion is formed on the upper side of each of the nanosheets 123c. That is, in the terminal cell C12, the faces of the nanosheets 122c on the same side as the exposed faces of the nanosheets 22c and 22d of the standard cell C4 having a logical function (on the lower side in FIG. 10A) are exposed from the dummy gate interconnect 143. The faces of the nanosheets 123c on the same side as the exposed faces of the nanosheets 23c and 23d of the standard cell C4 having a logical function (on the upper side in FIG. 10A) are exposed from the dummy gate interconnect 146.

In FIG. 1, by placing the terminal cell C12 instead of the terminal cell C11 when the standard cell C4 having a logical function is placed instead of the inverter cell C2, similar effects to those obtained with the terminal cell C11 can be obtained.

Also, in FIG. 10A, the upper faces of the nanosheets 122c are covered with the dummy gate interconnect 143, and the lower faces of the nanosheets 123c are covered with the dummy gate interconnect 146. That is, the faces of the nanosheets 122c on the same side as the non-exposed faces of the nanosheets 22c and 22d (on the upper side in FIGS. 9A and 10A) are not exposed from the dummy gate interconnect 143. The faces of the nanosheets 123c on the same side as the non-exposed faces of the nanosheets 23c and 23d (on the lower side in FIGS. 9A and 10A) are not exposed from the dummy gate interconnect 146. This makes it possible to achieve control of variations in the manufacture, and improvement in the yield and reliability, of the semiconductor integrated circuit device.

While, in the standard cell C4 in FIG. 9A, the upper faces of the nanosheets 22c and 22d are not exposed from the gate interconnects 41 and 42, and the lower faces thereof are exposed from the gate interconnects 41 and 42, respectively, the configuration is not limited to this. The nanosheets 22c and 22d may be configured so that their upper faces are exposed from the gate interconnects 41 and 42, respectively, and their lower faces are not exposed from the gate interconnects 41 and 42. In this case, in the terminal cell C12 in FIG. 10A, the upper faces of the nanosheets 122c should be exposed from the dummy gate interconnect 143 and the lower faces thereof should not be exposed from the dummy gate interconnect 143.

Also, while the upper faces of the nanosheets 23c and 23d are exposed from the gate interconnects 43 and 44, respectively, and the lower faces thereof are not exposed from the gate interconnects 43 and 44, the configuration is not limited to this. The nanosheets 23c and 23d may be configured so that their upper faces are not exposed from the gate interconnects 43 and 44, and their lower faces are exposed from the gate interconnects 43 and 44, respectively. In this case, in the terminal cell C12 in FIG. 10A, the upper faces of the nanosheets 123c should not be exposed from the dummy gate interconnect 146 and the lower faces thereof should be exposed from the dummy gate interconnect 146.

Second Embodiment

Figure 11:
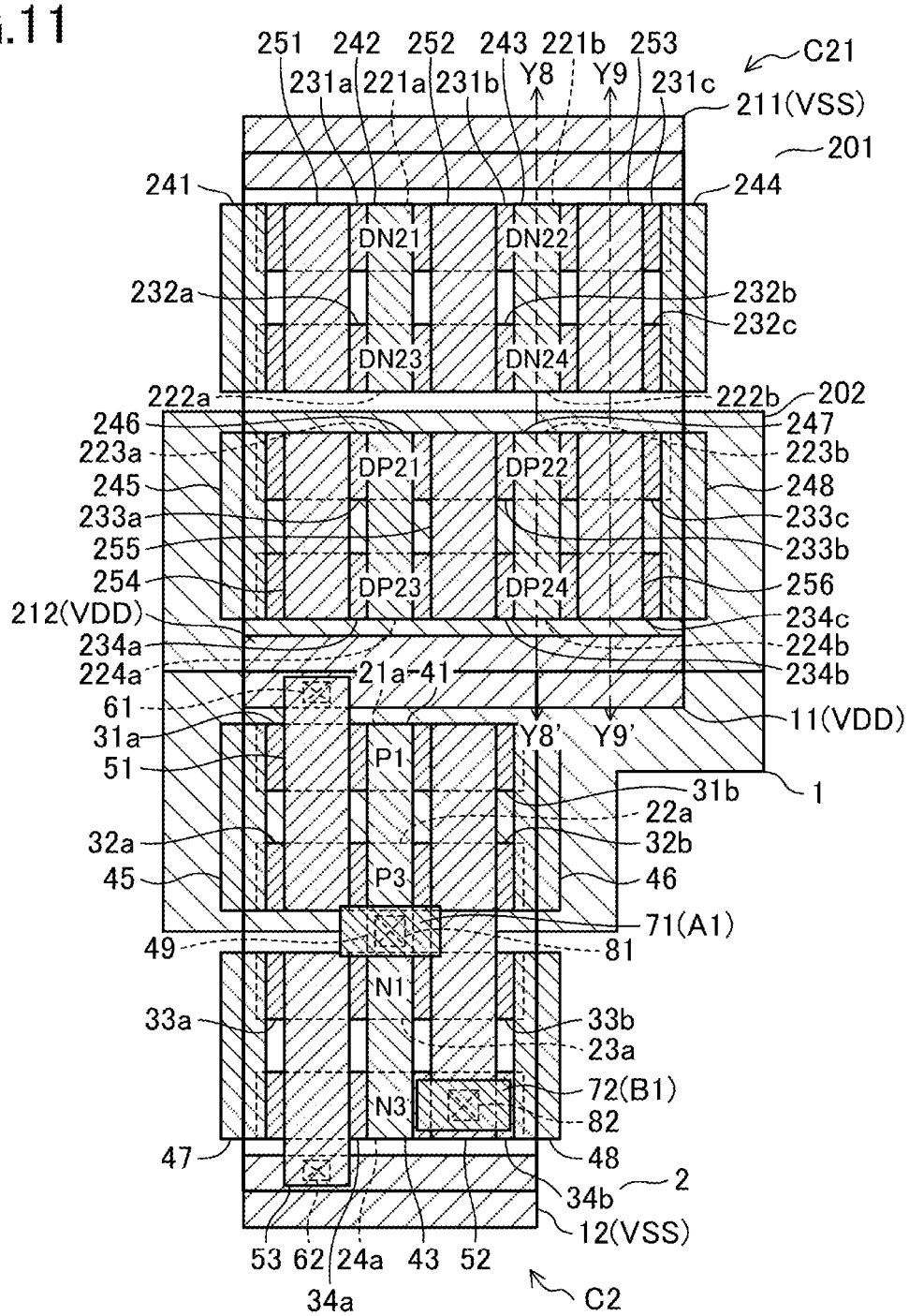
FIG. 11 is a plan view showing a layout structure of a semiconductor integrated circuit device according to the second embodiment.
Figure 12A:
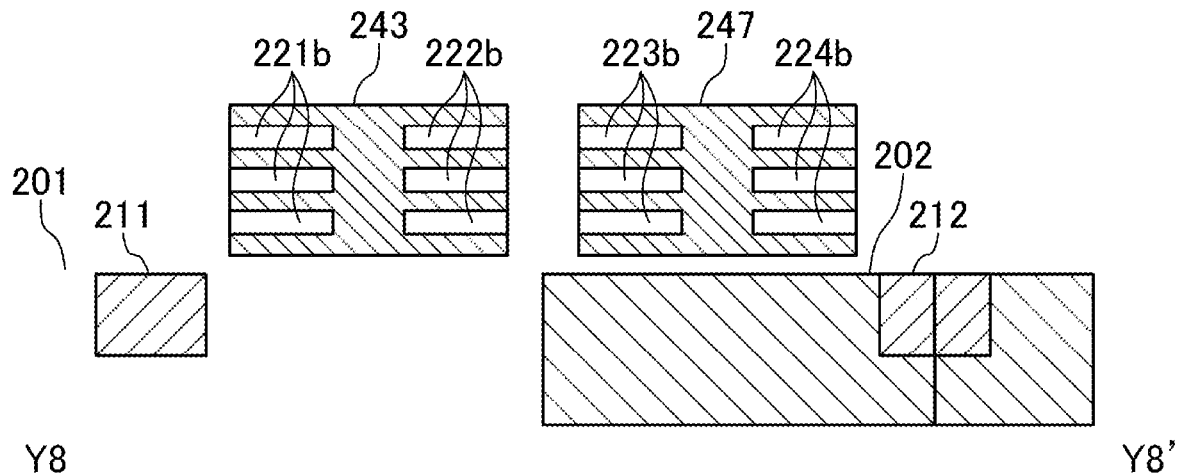
FIGS. 12A-12B are cross-sectional views showing a layout structure of a terminal cell according to the second embodiment.
Figure 12B:
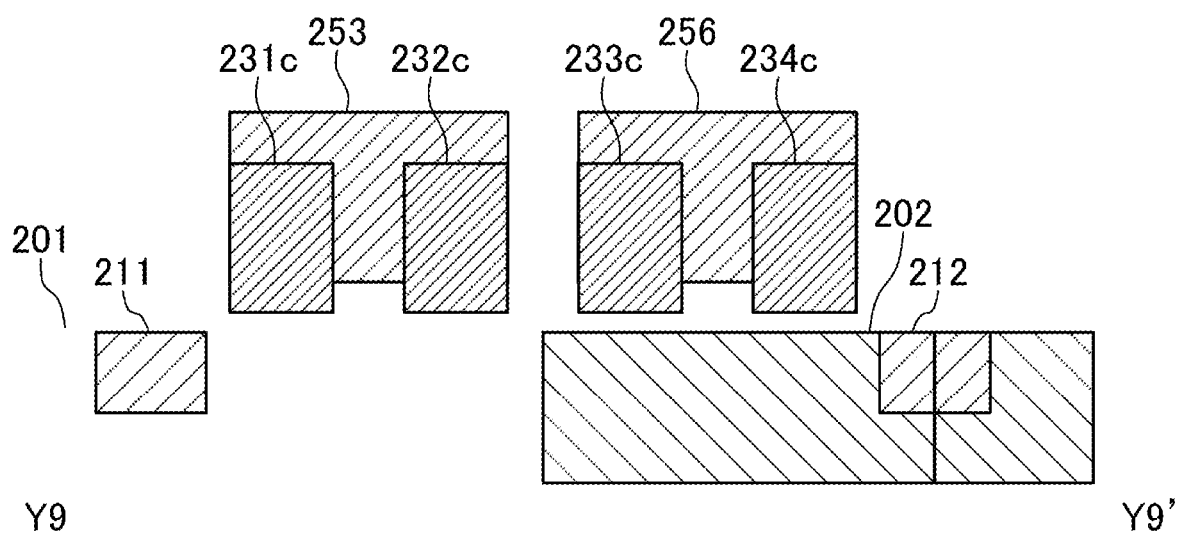

FIG. 11 is a plan view showing a layout structure of a semiconductor integrated circuit device according to the second embodiment, and FIGS. 12A-12B are cross-sectional views of the layout structure of the semiconductor integrated circuit device according to the second embodiment. Specifically, FIG. 11 is an enlarged view of a portion W2 in FIG. 1, FIG. 12A shows a cross section taken along line Y8-Y8' in FIG. 11, and FIG. 12B shows a cross section taken along line Y9-Y9' in FIG. 11.

As shown in FIGS. 1 and 11, a terminal cell C21 is placed in the uppermost cell row CRT and located on the upper side of an inverter cell C2 adjacently.

As shown in FIG. 11, in the terminal cell C21 formed are a P-substrate region 201 expanding in the X direction from the cell center over the upper part in the figure and an N-well region 202 expanding in the X direction from the cell center over the lower part in the figure.

Also formed are power supply lines 211 and 212 extending in the X direction along both ends of the cell in the Y direction. Both the power supply lines 211 and 212 are buried power rails (BPRs) formed in a buried interconnect layer: the power supply line 211, formed in the P-substrate region 201, supplies the power supply voltage VSS, and the power supply line 212, formed in the N-well region 202, supplies the power supply voltage VDD.

Nanosheets 221a to 224a and 221b to 224b expanding in the X and Y directions are formed in the terminal cell C21.

The nanosheets 221a and 222a overlap a dummy gate interconnect 242 as viewed in plan, and the nanosheets 221b and 222b overlap a dummy gate interconnect 243 as viewed in plan. The nanosheets 223a and 224a overlap a dummy gate interconnect 246 as viewed in plan, and the nanosheets 223b and 224b overlap a dummy gate interconnect 247 as viewed in plan. The nanosheets 221a, 221b, 222a, and 222b constitute the channel portions of dummy transistors DN21, DN22, DN23, and DN24, respectively. The nanosheets 223a, 223b, 224a, and 224b constitute the channel portions of dummy transistors DP21, DP22, DP23, and DP24, respectively.

Dummy pads 231a to 231c and 232a to 232c doped with an n-type semiconductor are formed on the left side of the nanosheets 221a, between the nanosheets 221a and 221b, on the right side of the nanosheets 221b, on the left side of the nanosheets 222a, between the nanosheets 222a and 222b, and on the right side of the nanosheets 222b, respectively, as viewed in the figure. The dummy pads 231a and 231b constitute the nodes of the dummy transistor DN21, the dummy pads 231b and 231c constitute the nodes of the dummy transistor DN22, the dummy pads 232a and 232b constitute the nodes of the dummy transistor DN23, and the dummy pads 232b and 232c constitute the nodes of the dummy transistor DN24.

Dummy pads 233a to 233c and 234a to 234c doped with a p-type semiconductor are formed on the left side of the nanosheets 223a, between the nanosheets 223a and 223b, on the right side of the nanosheets 223b, on the left side of the nanosheets 224a, between the nanosheets 224a and 224b, and on the right side of the nanosheets 224b, respectively, as viewed in the figure. The dummy pads 233a and 233b constitute the nodes of the dummy transistor DP21, the dummy pads 233b and 233c constitute the nodes of the dummy transistor DP22, the dummy pads 234a and 234b constitute the nodes of the dummy transistor DP23, and the dummy pads 234b and 234c constitute the nodes of the dummy transistor DP24.

Dummy gate interconnects 241 to 248 extending in the Y and Z directions are formed in the terminal cell C21. The dummy gate interconnects 241 and 245 are formed along the cell boundary between the terminal cell C21 and a cell placed on the left side of the terminal cell C21 adjacently as viewed in the figure. The dummy gate interconnects 244 and 248 are formed along the cell boundary between the terminal cell C21 and a cell placed on the right side of the terminal cell C21 adjacently as viewed in the figure. The dummy gate interconnect 242 is to be the gates of the dummy transistors DN21 and DN23, the dummy gate interconnect 243 is to be the gates of the dummy transistors DN22 and DN24, the dummy gate interconnect 246 is to be the gates of the dummy transistors DP21 and DP23, and the dummy gate interconnect 247 is to be the gates of the dummy transistors DP22 and DP24.

Local interconnects 251 to 256 extending in the Y direction are formed above the dummy pads 231a to 234a, 231b to 234b, and 231c to 234c. The local interconnect 251 is connected with the dummy pads 231a and 232a, the local interconnect 252 is connected with the dummy pads 231b and 232b, and the local interconnect 253 is connected with the dummy pads 231c and 232c. The local interconnect 254 is connected with the dummy pads 233a and 234a, the local interconnect 255 is connected with the dummy pads 233b and 234b, and the local interconnect 256 is connected with the dummy pads 233c and 234c.

As shown in FIG. 12A, each of the nanosheets 221b to 224b has an exposed portion (a portion that is not surrounded by a dummy gate interconnect) on its periphery in the Y and Z directions. Specifically, the left side faces of the nanosheets 221b are not covered with the dummy gate interconnect 243, and the right side faces of the nanosheets 222b are not covered with the dummy gate interconnect 243, as viewed in the figure. The left side faces of the nanosheets 223b are not covered with the dummy gate interconnect 247, and the right side faces of the nanosheets 224b are not covered with the dummy gate interconnect 247, as viewed in the figure.

That is, the nanosheets 221b and 223b each have an exposed portion on the left side in the figure (on the upper side in FIG. 11), and the nanosheets 222b and 224b each have an exposed portion on the right side in the figure (on the lower side in FIG. 11). Similarly, in FIG. 11, the nanosheets 221a and 223a each have an exposed portion on the upper side, and the nanosheets 222a and 224a each have an exposed portion on the lower side.

Accordingly, the faces of the nanosheets 224a and 224a on the side opposed to the nanosheets 21a of the inverter cell C2 (on the lower side in FIG. 11) are exposed from the dummy gate interconnects 246 and 247, respectively.

Also, in FIG. 11, the nanosheets 221a to 224a and 221b to 224b are formed in the same layer as the nanosheets 21a to 24a.

The nanosheets 221a to 224a are formed at the same position as the nanosheets 21a to 24a in the X direction.

The dummy pads 231a to 234a, 231b to 234b, and 231c to 234c are formed in the same layer as the pads 31a to 34a and 31b to 34b.

The dummy pads 231a to 231c are formed at the same position in the Y direction and placed at an equal pitch in the X direction. The dummy pads 232a to 232c are formed at the same position in the Y direction and placed at an equal pitch in the X direction. The dummy pads 233a to 233c are formed at the same position in the Y direction and placed at an equal pitch in the X direction. The dummy pads 234a to 234c are formed at the same position in the Y direction and placed at an equal pitch in the X direction.

The dummy pads 231a to 234a are formed at the same position as the pads 31a to 34a in the X direction, and the dummy pads 231b to 234b are formed at the same position as the pads 31b to 34b in the X direction.

Also, the dummy gate interconnects 241 to 248 are formed in the same layer as the gate interconnects 41 and 43 and the dummy gate interconnects 45 to 48.

The dummy gate interconnects 241 to 244 are formed at the same position in the Y direction and placed at an equal pitch in the X direction. The dummy gate interconnects 245 to 248 are formed at the same position in the Y direction and placed at an equal pitch in the X direction.

The dummy gate interconnects 241 to 244 are aligned at their upper and lower ends in the Y direction, and the dummy gate interconnects 245 to 248 are aligned at their upper and lower ends in the Y direction, as viewed in the figure.

The dummy gate interconnects 241 and 245 are formed at the same position as the dummy gate interconnects 45 and 47 in the X direction, the dummy gate interconnects 242 and 246 are formed at the same position as the gate interconnects 41 and 43 in the X direction, and the dummy gate interconnects 243 and 247 are formed at the same position as the dummy gate interconnects 46 and 48 in the X direction.

Also, the local interconnects 251 to 256 are formed in the same layer as the local interconnects 51 to 53.

The local interconnects 251 to 253 are formed at the same position in the Y direction and placed at an equal pitch in the X direction. The local interconnects 254 to 256 are formed at the same position in the Y direction and placed at an equal pitch in the X direction.

The local interconnects 251 and 254 are formed at the same position as the local interconnects 51 and 53 in the X direction, and the local interconnects 252 and 255 are formed at the same position as the local interconnect 52 in the X direction.

With the above configuration, the semiconductor integrated circuit device includes a plurality of cell rows CR each having a plurality of standard cells arranged in the X direction. A cell row CRC includes an inverter cell C2 having a logical function, and the uppermost cell row CRT includes a terminal cell C21 having no logical function. The terminal cell C21 is placed on the upper side of the inverter cell C2 adjacently as viewed in the figure. The inverter cell C2 includes: the N-well region 202 that is a region for formation of p-type transistors; the P-substrate region 201 that is a region for formation of n-type transistors; the nanosheets 21a extending in the X direction, formed in the N-well region 202; the nanosheets 24a extending in the X direction, formed in the P-substrate region 201 and also formed at the same position as the nanosheets 21a in the X direction; the gate interconnect 41 extending in the Y direction, surrounding the peripheries of the nanosheets 21a in the Y and Z directions; and the gate interconnect 43 extending in the Y direction, surrounding the peripheries of the nanosheets 24a in the Y and Z directions. The terminal cell C21 includes: the nanosheets 224a extending in the X direction, formed at the same position as the nanosheets 21a in the X direction and also formed adjacent to the nanosheets 21a in the Y direction; and the dummy gate interconnect 246 extending in the Y direction, surrounding the peripheries of the nanosheets 224a in the Y and Z directions. The upper faces of the nanosheets 21a in the figure are exposed from the gate interconnect 41, and the lower faces of the nanosheets 24a in the figure are exposed from the gate interconnect 43. The lower faces of the nanosheets 224a in the figure are exposed from the dummy gate interconnect 246.

That is, in the nanosheets 21a and 224a placed adjacently in the Y direction, their faces opposed to each other are exposed from the gate interconnect 41 and the dummy gate interconnect 246, respectively. This makes it possible to achieve control of variations in the manufacture, and improvement in the yield and reliability, of the semiconductor integrated circuit device.

The nanosheets 21a and 224a are formed adjacently in the Y direction. Therefore, since no protrusion of the gate interconnect or the dummy gate interconnect is necessary between the nanosheets 21a and 224a, it is possible to achieve reduction in the area of the semiconductor integrated circuit device.

Also, the faces of the nanosheets 222a and 223a opposed to each other are exposed from the dummy gate interconnects 242 and 246, respectively. Therefore, since no protrusion of the gate interconnect (dummy gate interconnect) is necessary between the nanosheets 222a and 223a, it is possible to achieve reduction in the area of the semiconductor integrated circuit device.

The nanosheets 221a to 224a and 221b to 224b are formed in the same layer as the nanosheets 21a to 24a. The dummy pads 231a to 234a, 231b to 234b, and 231c to 234c are formed in the same layer as the pads 31a to 34a and 31b to 34b. The dummy gate interconnects 241 to 248 are formed in the same layer as the gate interconnects 41 and 43 and the dummy gate interconnects 45 to 48. The local interconnects 251 to 256 are formed in the same layer as the local interconnects 51 to 53. That is, with formation of nanosheets, dummy pads, dummy gate interconnects, and local interconnects in a terminal cell, pads including dummy pads, gate interconnects including dummy gate interconnects, and local interconnects are placed regularly. This makes it possible to control variations in the finished shape of the layout pattern of cells located inside with respect to the terminal cell, and thus achieve control of variations in the manufacture, and improvement in the yield and reliability, of the semiconductor integrated circuit device.

Also, the nanosheets 221a to 224a are formed at the same position as the nanosheets 21a to 24a in the X direction. The dummy pads 231a to 234a are formed at the same position as the pads 31a to 34a in the X direction, and the dummy pads 231b to 234b are formed at the same position as the pads 31b to 34b in the X direction. The dummy gate interconnects 241 and 245 are formed at the same position as the dummy gate interconnects 45 and 47 in the X direction, the dummy gate interconnects 242 and 246 are formed at the same position as the gate interconnects 41 and 43 in the X direction, and the dummy gate interconnects 243 and 247 are formed at the same position as the dummy gate interconnects 46 and 48 in the X direction. The local interconnects 251 and 254 are formed at the same position as the local interconnects 51 and 53 in the X direction, and the local interconnects 252 and 255 are formed at the same position as the local interconnect 52 in the X direction. That is, in the terminal cell C21, nanosheets, dummy pads, dummy gate interconnects, and local interconnects are formed over the entire cell. This makes it possible to control variations in the finished shape of the layout pattern of cells located inside with respect to the terminal cell, and thus achieve control of variations in the manufacture, and improvement in the yield and reliability, of the semiconductor integrated circuit device.

The cell width of the terminal cell C21 may be larger than, or smaller than, the size illustrated in FIG. 11.

While the terminal cell C21 includes eight dummy transistors, DP21 to DP24 and DN21 to DN24, the number of dummy transistors provided in the terminal cell C21 is not limited to eight.

While the terminal cell C21 includes eight dummy gate interconnects, 241 to 248, the number of dummy gate interconnects formed in the terminal cell C21 is not limited to eight.

While the terminal cell C21 includes six local interconnects, 251 to 256, the number of local interconnects provided in the terminal cell C21 is not limited to six.

In FIG. 1, the terminal cell C21 may be placed instead of the terminal cells C11a and C11c in the uppermost cell row CRT, and a terminal cell C21a, which is a cell inverted from the terminal cell C21 in the Y direction, may be placed instead of the terminal cells C11 and C11b in the lowermost cell row CRB.

(Variation 1 of Terminal Cell C21)

Figure 13A:
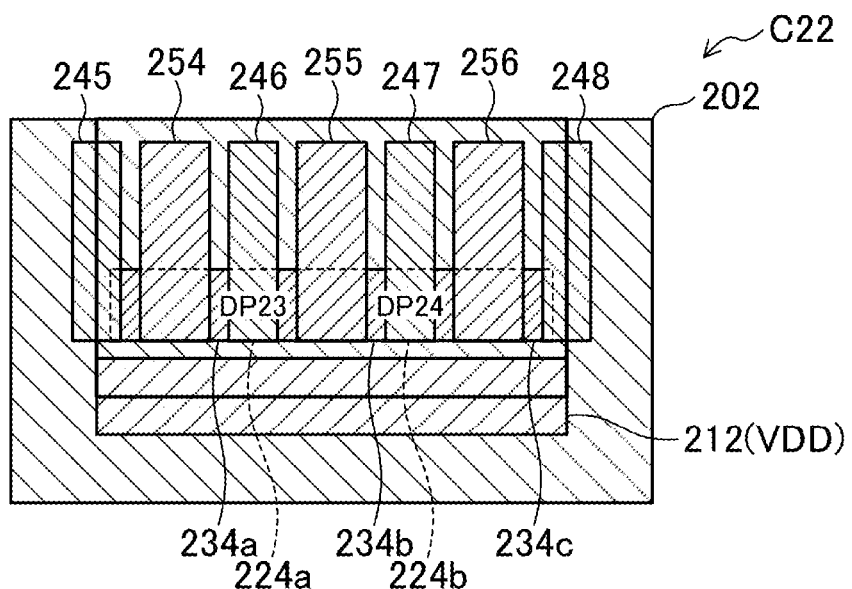
FIGS. 13A-13B are plan views showing variations of the layout structure of the terminal cell according to the second embodiment.
Figure 13B:
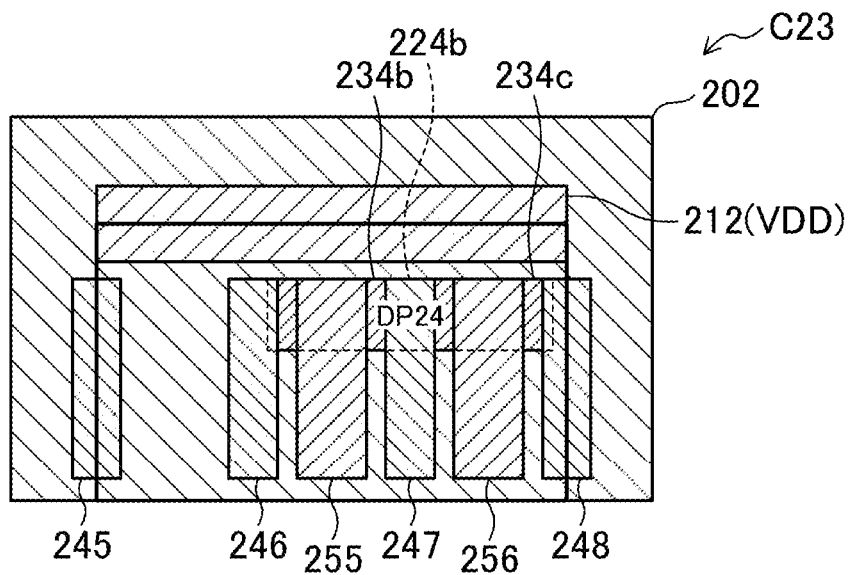

FIGS. 13A-13B are plan views showing variations of the layout structure of the terminal cell according to the second embodiment. Specifically, FIG. 13A shows a layout structure of a terminal cell C22, and FIG. 13B shows a layout structure of a terminal cell C23.

As shown in FIG. 13A, in the terminal cell C22, in comparison with the terminal cell C21, the cell size in the Y direction is halved, and the dummy transistors DN21 to DN24, DP21, and DP22 are not formed. Specifically, the terminal cell C22 does not have any of the P-substrate region 201, the power supply line 211, the nanosheets 221a, 221b, 222a, 222b, 223a, and 223b, the dummy pads 231a to 231c, 232a to 232c, and 233a to 233c, the dummy gate interconnects 241 to 244, and the local interconnects 251 to 253.

In FIG. 1, by placing the terminal cell C22 instead of the terminal cell C21, similar effects to those obtained by the terminal cell C21 can be obtained. Also, since the terminal cell C22 is smaller in cell size in the Y direction than the terminal cell C21, reduction in the area of the semiconductor integrated circuit can be achieved.

As shown in FIG. 13B, the terminal cell C23 is obtained by inverting the terminal cell C22 in the Y direction and omitting the dummy transistor DP23. Specifically, the terminal cell C23 does not have any of the nanosheets 224a, the dummy pad 234a, and the local interconnect 254.

In FIG. 1, by placing the terminal cell C23 instead of the terminal cell C11 at the left end of the lowermost cell row CRB in the figure, similar effects to those obtained by the terminal cell C21 (terminal cell C11) can be obtained. Also, since the terminal cell C23 is smaller in cell size in the Y direction than the terminal cell C21, reduction in the area of the semiconductor integrated circuit can be achieved.

Note that, in FIG. 1, the terminal cell C22 may be placed instead of the terminal cells C11a and C11c in the uppermost cell row CRT, and a cell inverted from the terminal cell C22 in the Y direction may be placed instead of the terminal cells C11 and C11b in the lowermost cell row CRB.

(Variation 2 of Terminal cell C21)

FIGS. 14A-14C are plan views showing variations of the layout structure of the terminal cell according to the second embodiment. Specifically, FIG. 14A shows a plan view of a terminal cell C24, FIG. 14B shows a plan view of a terminal cell C25, and FIG. 14C shows a plan view of a terminal cell C26.

In FIG. 1, when the standard cell C4 having a logical function is placed instead of the inverter cell C2, any of the terminal cells C24 to C26 is to be placed instead of the terminal cell C21.

While two nanosheet FETs are provided for one dummy gate interconnect in the terminal cell C21, one nanosheet FET is provided for one dummy gate interconnect in the terminal cells C24 to C26.

As shown in FIG. 14A, in the terminal cell C24, nanosheets 222c, 222d, 223c, and 223d expanding in the X and Y directions are formed, and overlap the dummy gate interconnects 242, 243, 246, and 247, respectively, as viewed in plan. The nanosheets 222c, 222d, 223c, and 223d constitute the channel portions of dummy transistors DN25, DN26, DP25, and DP26, respectively.

Dummy pads 232d to 232f doped with an n-type semiconductor are formed on the left side of the nanosheets 222c, between the nanosheets 222c and 222d, and on the right side of the nanosheets 222d, respectively, as viewed in the figure.

Dummy pads 233d to 233f doped with a p-type semiconductor are formed on the left side of the nanosheets 223c, between the nanosheets 223c and 223d, and on the right side of the nanosheets 223d, respectively, as viewed in the figure.

The dummy pads 232d and 232e constitute the nodes of the dummy transistor DN25, the dummy pads 232e and 232f constitute the nodes of the dummy transistor DN26, the dummy pads 233d and 233e constitute the nodes of the dummy transistor DP25, and the dummy pads 233e and 233f constitute the nodes of the dummy transistor DP26.

The dummy gate interconnect 242 is to be the gate of the dummy transistor DN25, the dummy gate interconnect 243 is to be the gate of the dummy transistor DN26, the dummy gate interconnect 246 is to be the gate of the dummy transistor DP25, and the dummy gate interconnect 247 is to be the gate of the dummy transistor DP26.

The local interconnects 251 to 256 are connected with the dummy pads 232d to 232f and 233d to 233f, respectively.

As shown in FIG. 14A, each of the nanosheets 222c, 222d, 223c, and 223d has an exposed portion on its periphery in the Y and Z directions. Specifically, an exposed portion is formed on the lower side of each of the nanosheets 222c and 222d, and an exposed portion is formed on the upper side of each of the nanosheets 223c and 223d, as viewed in the figure.

That is, in the terminal cell C24, the faces of the nanosheets 222c and 223c opposed to each other are exposed from the dummy gate interconnects 242 and 246, respectively. The faces of the nanosheets 222d and 223d opposed to each other are exposed from the dummy gate interconnects 243 and 247, respectively.

In FIG. 1, by placing the terminal cell C24 instead of the terminal cell C21 when the standard cell C4 having a logical function is placed instead of the inverter cell C2, similar effects to those obtained by the terminal cell C21 can be obtained.

Also, in FIG. 14A, the lower faces of the nanosheets 223c and 223d in the figure are covered with the dummy gate interconnects 246 and 247, respectively. That is, the faces of the nanosheets 22c and 22d of the standard cell C4 and the faces of the nanosheets 223c and 223d of the terminal cell C24, which are opposed to each other, are not exposed from the gate interconnects or the dummy gate interconnects. This makes it possible to achieve control of variations in the manufacture, and improvement in the yield and reliability, of the semiconductor integrated circuit device.

As shown in FIG. 14B, in the terminal cell C25, in comparison with the terminal cell C24, the cell size in the Y direction is halved, and the dummy transistors DN25 and DN26 are not formed. Specifically, the terminal cell C25 does not have any of the P-substrate region 201, the power supply line 211, the nanosheets 222c and 222d, the dummy pads 232d to 232f, the dummy gate interconnects 241 to 244, and the local interconnects 251 to 253.

In FIG. 1, by placing the terminal cell C25 instead of the terminal cell C21 when the standard cell C4 having a logical function is placed instead of the inverter cell C2, similar effects to those obtained by the terminal cell C24 can be obtained. Also, since the terminal cell C25 is smaller in cell size in the Y direction than the terminal cell C21, reduction in the area of the semiconductor integrated circuit can be achieved.

As shown in FIG. 14C, in the terminal cell C26, in comparison with the terminal cell C24, the cell size in the Y direction is halved, and no exposed portion is formed in the periphery of each of the nanosheets 223c and 223d in the Y and Z directions. That is, the peripheries of the nanosheets 223c and 223d in the Y and Z directions are covered with the dummy gate interconnects 246 and 247, respectively.

In FIG. 1, by placing the terminal cell C26 instead of the terminal cell C21 when the standard cell C4 having a logical function is placed instead of the inverter cell C2, similar effects to those obtained by the terminal cell C24 can be obtained. Also, since the terminal cell C26 is smaller in cell size in the Y direction than the terminal cell C21, reduction in the area of the semiconductor integrated circuit can be achieved.

Note that, in FIG. 1, a cell inverted from any one of the terminal cells C24 to C26 in the Y direction may be placed instead of each terminal cell C21a. Also, any one of the terminal cells C24 to C26 may be placed instead of the terminal cells C11a and C11c in the uppermost cell row CRT, and a cell inverted from any one of the terminal cells C24 to C26 in the Y direction may be placed instead of the terminal cells C11 and C11b in the lowermost cell row CRB.

While each terminal cell is placed adjacent to the inverter cell C2 in the above embodiments, the configuration is not limited to this. The terminal cell may be placed adjacent to any other type of standard cell.

The number of nanosheets included in one nanosheet FET is not limited to three, but may be two or less or four or more.

While the cross-sectional shape of the nanosheets is illustrated as rectangular in the above embodiments, it is not limited to this. For example, the shape may be square, circular, or oval.

While the circuit block is illustrated as rectangular in FIG. 1, it is not limited to this. Also, the number of cell rows CR placed in the circuit block is not limited to six.

Since the present disclosure can be applied to a semiconductor integrated circuit device provided with standard cells using forksheet transistors, it is possible to achieve control of variations in the manufacture, and improvement in the yield and reliability, of the semiconductor integrated circuit device.

What is claimed is:

1. A semiconductor integrated circuit device comprising a plurality of cell rows each having a plurality of standard cells arranged in a first direction, wherein:
   a first cell row, as one of the plurality of cell rows, includes a first standard cell having a logical function and a second standard cell having no logical function placed at at least one of both ends of the first cell row,
   the first standard cell includes:
      a first region that is a region for formation of a transistor of a first conductivity type,
      a second region that is a region for formation of a transistor of a second conductivity type different from the first conductivity type and is adjacent to the first region in a second direction perpendicular to the first direction,
      a first nanosheet extending in the first direction, formed in the first region,
      a second nanosheet extending in the first direction, formed in the second region,
      a first gate interconnect extending in the second direction, surrounding a periphery of the first nanosheet in the second direction and in a third direction perpendicular to the first and second directions, and
      a second gate interconnect extending in the second direction, surrounding a periphery of the second nanosheet in the second and third directions,
   the second standard cell includes:
      a third nanosheet extending in the first direction, formed at the same position as the first nanosheet in the second direction,
      a fourth nanosheet extending in the first direction, formed at the same position as the second nanosheet in the second direction,
      a first dummy gate interconnect extending in the second direction, surrounding a periphery of the third nanosheet in the second and third directions, and
      a second dummy gate interconnect extending in the second direction, surrounding a periphery of the fourth nanosheet in the second and third directions,
   in a first cross section cutting the first gate interconnect by a first plane defined by the second and third directions along the second direction, a face of the first nanosheet on a first side that is one side in the second direction is exposed from the first gate interconnect,
   in a second cross section cutting the second gate interconnect by a second plane defined by the second and third directions along the second direction, a face of the second nanosheet on a second side that is one side in the second direction is exposed from the second gate interconnect,
   in a third cross section cutting the first dummy gate interconnect by a third plane defined by the second and third directions along the second direction, a face of the third nanosheet on the first side in the second direction is exposed from the first dummy gate interconnect, and
   in a fourth cross section cutting the second dummy gate interconnect by a fourth plane defined by the second and third directions along the second direction, a face of the fourth nanosheet on the second side in the second direction is exposed from the second dummy gate interconnect.

2. The semiconductor integrated circuit device of claim 1, wherein
   the first side is a side of the first nanosheet closer to the second region, and
   the second side is a side of the second nanosheet closer to the first region.

3. The semiconductor integrated circuit device of claim 1, wherein
   the first side is a side of the first nanosheet farther from the second region, and
   the second side is a side of the second nanosheet farther from the first region.

4. The semiconductor integrated circuit device of claim 1, wherein:
   the first standard cell further includes
      a fifth nanosheet extending in the first direction, formed in the first region, and
      a sixth nanosheet extending in the first direction, formed in the second region, the second standard cell further includes
      a seventh nanosheet extending in the first direction, formed at the same position as the fifth nanosheet in the second direction, and
      an eighth nanosheet extending in the first direction, formed at the same position as the sixth nanosheet in the second direction,
   the first gate interconnect surrounds a periphery of the fifth nanosheet in the second and third directions,
   the second gate interconnect surrounds a periphery of the sixth nanosheet in the second and third directions,
   the first dummy gate interconnect surrounds a periphery of the seventh nanosheet in the second and third directions,
   the second dummy gate interconnect surrounds a periphery of the eighth nanosheet in the second and third directions,
   in the first cross section, a face of the fifth nanosheet on a side opposite to the first side in the second direction is exposed from the first gate interconnect,
   in the second cross section, a face of the sixth nanosheet on a side opposite to the second side in the second direction is exposed from the second gate interconnect,
   in the third cross section, a face of the seventh nanosheet on a side opposite to the first side in the second direction is exposed from the first dummy gate interconnect, and in the fourth cross section, a face of the eighth nanosheet on a side opposite to the second side in the second direction is exposed from the second dummy gate interconnect.

5. The semiconductor integrated circuit device of claim 4, wherein
third and fourth dummy gate interconnects extending in the second direction are formed along a cell boundary between the first and second standard cells,
the first gate interconnect and the first and third dummy gate interconnects are placed at an equal pitch in the first direction, and
the second gate interconnect and the second and fourth dummy gate interconnects are placed at an equal pitch in the first direction.

6. A semiconductor integrated circuit device comprising a plurality of cell rows each having a plurality of standard cells arranged in a first direction, the plurality of cell rows being arranged in a second direction perpendicular to the first direction, wherein:
the plurality of cell rows include a first cell row including a first standard cell having a logical function and a second cell row including a second standard cell having no logical function, the second cell row being placed in either one of both ends of the plurality of cell rows in the second direction,
the first standard cell includes
a first region that is a region for formation of a transistor of a first conductivity type,
a second region that is a region for formation of a transistor of a second conductivity type different from the first conductivity type and is adjacent to the first region in the second direction,
a first nanosheet extending in the first direction, formed in the first region,
a second nanosheet extending in the first direction, formed in the second region, and formed at the same position as the first nanosheet in the first direction,
a first gate interconnect extending in the second direction, surrounding a periphery of the first nanosheet in the second direction and in a third direction perpendicular to the first and second directions, and
a second gate interconnect extending in the second direction, surrounding a periphery of the second nanosheet in the second and third directions,
the second standard cell includes
a third nanosheet extending in the first direction, formed at the same position as the first nanosheet in the first direction, and formed adjacent to the first nanosheet in the second direction, and
a first dummy gate interconnect extending in the second direction, surrounding a periphery of the third nanosheet in the second and third directions, and
in a first cross section cutting the first gate interconnect by a first plane defined by the second and third directions along the second direction, a face of the first nanosheet on a first side that is one side in the second direction is exposed from the first gate interconnect,
in a second cross section cutting the second gate interconnect by a second plane defined by the second and third directions along the second direction, a face of the second nanosheet on a second side that is one side in the second direction is exposed from the second gate interconnect, and
in a third cross section cutting the first dummy gate interconnect by a third plane defined by the second and third directions along the second direction, faces of the first and third nanosheets opposed to each other are exposed from the first gate interconnect and the first dummy gate interconnect, respectively, or faces of the first and third nanosheets opposed to each other are not exposed from the first gate interconnect and the first dummy gate interconnect, respectively.

7. The semiconductor integrated circuit device of claim 6, wherein
the first side is a side of the first nanosheet opposed to the third nanosheet, and
a face of the third nanosheet on a side opposed to the first nanosheet is exposed from the first dummy gate interconnect.

8. The semiconductor integrated circuit device of claim 6, wherein
the first side is a side of the first nanosheet farther from the third nanosheet, and a face of the third nanosheet on a side farther from the first nanosheet is exposed from the first dummy gate interconnect.

9. The semiconductor integrated circuit device of claim 6, wherein
the second standard cell further includes
a fourth nanosheet extending in the first direction, formed at the same position as the first nanosheet in the first direction, and
a second dummy gate interconnect extending in the second direction, surrounding a periphery of the fourth nanosheet in the second and third directions,
in the third cross section, a face of the third nanosheet on a side opposite to the first side in the second direction is exposed from the first dummy gate interconnect, and
in a fourth cross section cutting the second dummy gate interconnect by a fourth plane defined by the second and third directions along the second direction, a face of the fourth nanosheet on a side opposite to the second side in the second direction is exposed from the second dummy gate interconnect.

10. The semiconductor integrated circuit device of claim 9, wherein:
the first standard cell further includes
a fifth nanosheet extending in the first direction, formed in the first region, and formed at the same position as the first nanosheet in the first direction, and
a sixth nanosheet extending in the first direction, formed in the second region, and formed at the same position as the first nanosheet in the first direction,
the second standard cell further includes
a seventh nanosheet extending in the first direction, formed at the same position as the first nanosheet in the first direction, and
an eighth nanosheet extending in the first direction, formed at the same position as the first nanosheet in the first direction,
the first gate interconnect surrounds a periphery of the fifth nanosheet in the second and third directions,
the second gate interconnect surrounds a periphery of the sixth nanosheet in the second and third directions,
the first dummy gate interconnect surrounds a periphery of the seventh nanosheet in the second and third directions,
the second dummy gate interconnect surrounds a periphery of the eighth nanosheet in the second and third directions, and
in the first cross section, a face of the fifth nanosheet on a side opposite to the first side in the second direction is exposed from the first gate interconnect, in the second cross section, a face of the sixth nanosheet on a side opposite to the second side in the second direction is exposed from the second gate interconnect, in the third cross section, a face of the seventh nanosheet on the first side in the second direction is exposed from the first dummy gate interconnect, and in the fourth cross section, a face of the eighth nanosheet on the second side in the second direction is exposed from the second dummy gate interconnect.

11. The semiconductor integrated circuit device of claim 6, wherein the first and second gate interconnects and the first dummy gate interconnect are formed at the same position in the first direction.

* * * * *